United States Patent [19]

Tobita

[11] Patent Number: 5,065,091

[45] Date of Patent: Nov. 12, 1991

[54] SEMICONDUCTOR INTEGRATED CIRCUIT DEVICE TESTING

[75] Inventor: Youichi Tobita, Itami, Japan

[73] Assignee: Mitsubishi Denki Kabushiki Kaisha, Tokyo, Japan

[21] Appl. No.: 487,055

[22] Filed: Mar. 5, 1990

[30] Foreign Application Priority Data

Mar. 8, 1989 [JP] Japan .................................. 1-56609

[51] Int. Cl.⁵ .......................................... G01A 31/02
[52] U.S. Cl. ................................ 324/158 R; 324/73.1
[58] Field of Search .................. 324/73.1, 158 R, 500, 324/537, 555; 365/233, 201, 226, 189.01-189.03; 371/21.1, 20, 21.3, 15.1

[56] References Cited

U.S. PATENT DOCUMENTS

| | | | |
|---|---|---|---|
| 3,969,706 | 7/1976 | Proebsting et al. | 365/233 |
| 4,455,628 | 6/1984 | Ozaki et al. | 365/226 |
| 4,513,399 | 4/1985 | Tobita | 365/189.06 |
| 4,654,849 | 3/1987 | White, Jr. et al. | 365/201 |
| 4,725,985 | 2/1988 | Ogura et al. | 365/201 |
| 4,837,505 | 6/1989 | Mitsunobu | 324/158 R |
| 4,841,233 | 6/1989 | Yoshida | 324/158 R |

OTHER PUBLICATIONS

McAdams et al., "A 1-Mbit CMOS Dynamic RAM With Design-For Test Functions," *IEEE Journal of Solid-State Circuits*, vol. SC-21, No. 5, Oct. 1986, pp. 635-642.

*Primary Examiner*—Kenneth A. Wieder
*Assistant Examiner*—Vinh P. Nguyen
*Attorney, Agent, or Firm*—Lowe, Price, Leblanc and Becker

[57] ABSTRACT

A substrate voltage generating circuit is provided on a semiconductor substrate, and the substrate voltage generating circuit generates a voltage to be applied to the semiconductor substrate. A value of the voltage generated by the substrate voltage generating circuit is changed corresponding to a switching of an operational mode of a semiconductor integrated circuit device from a normal mode to a test mode. Thus, operational characteristics of the semiconductor integrated circuit device in a test mode is changed, so that defective products can be detected in a simple short time test.

18 Claims, 14 Drawing Sheets

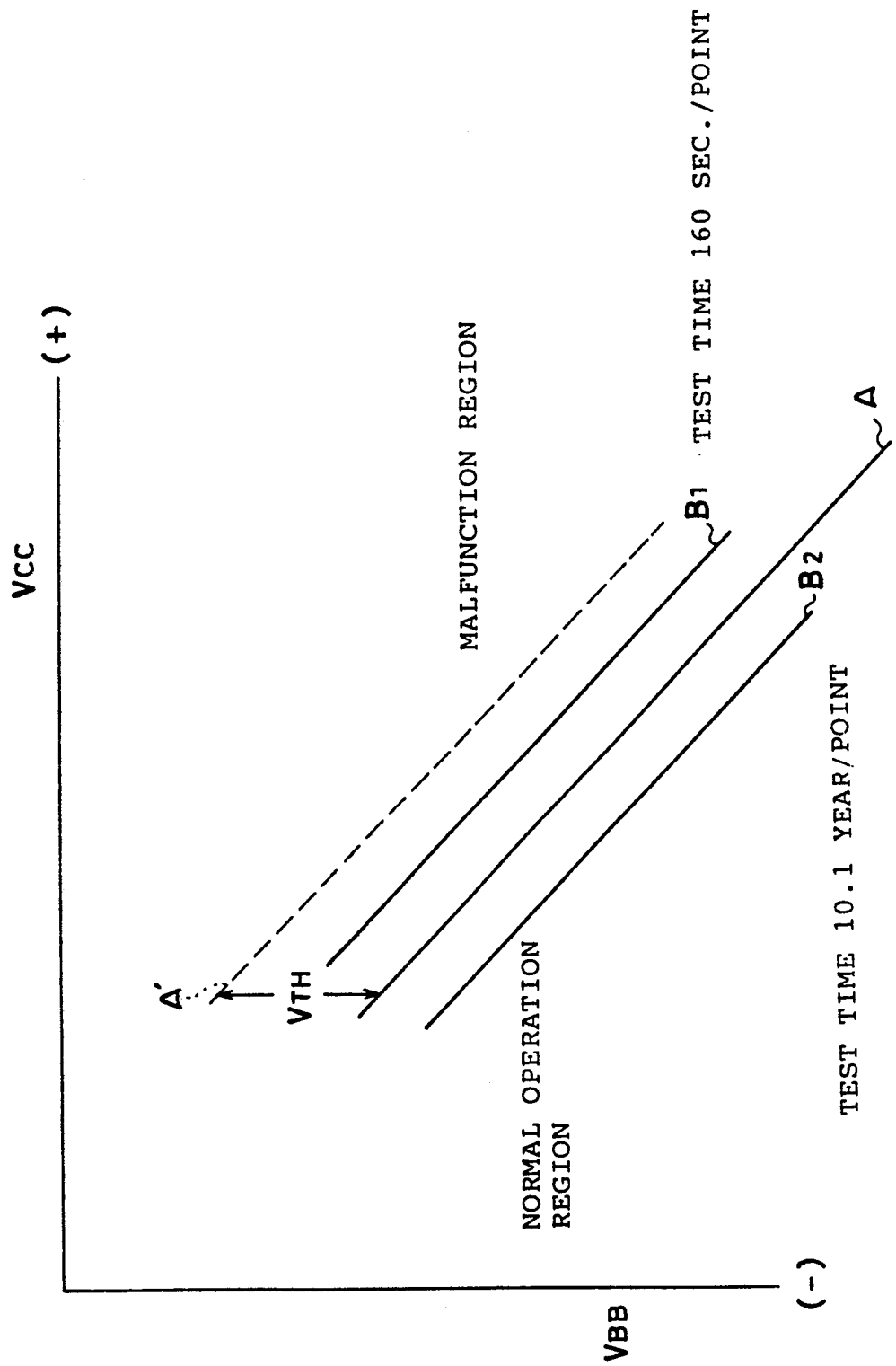

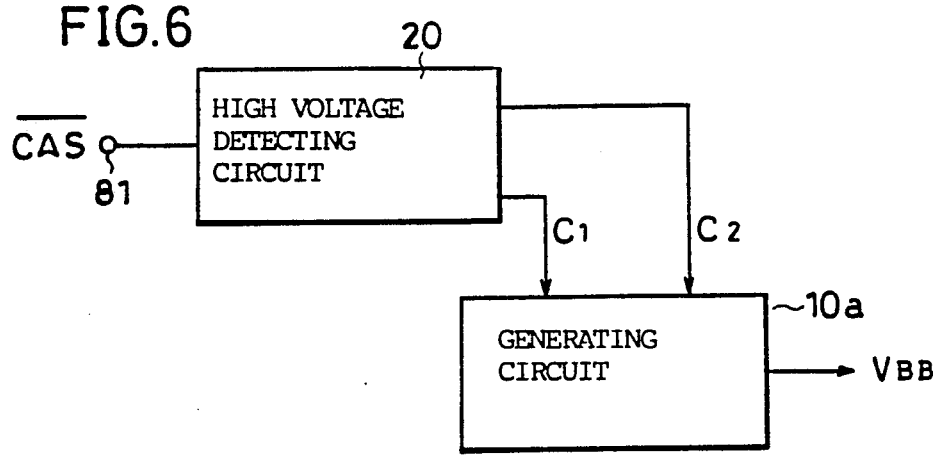
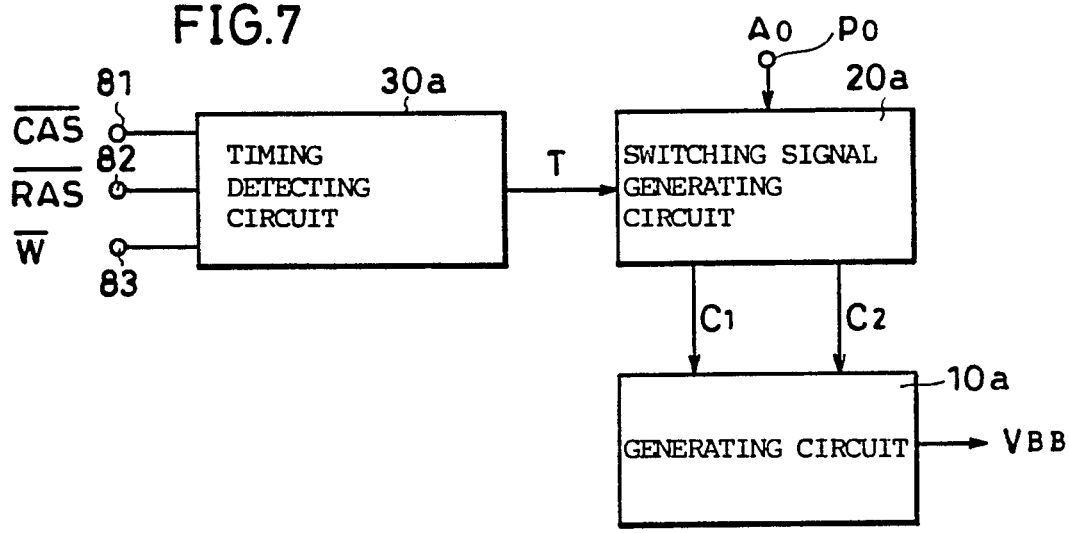
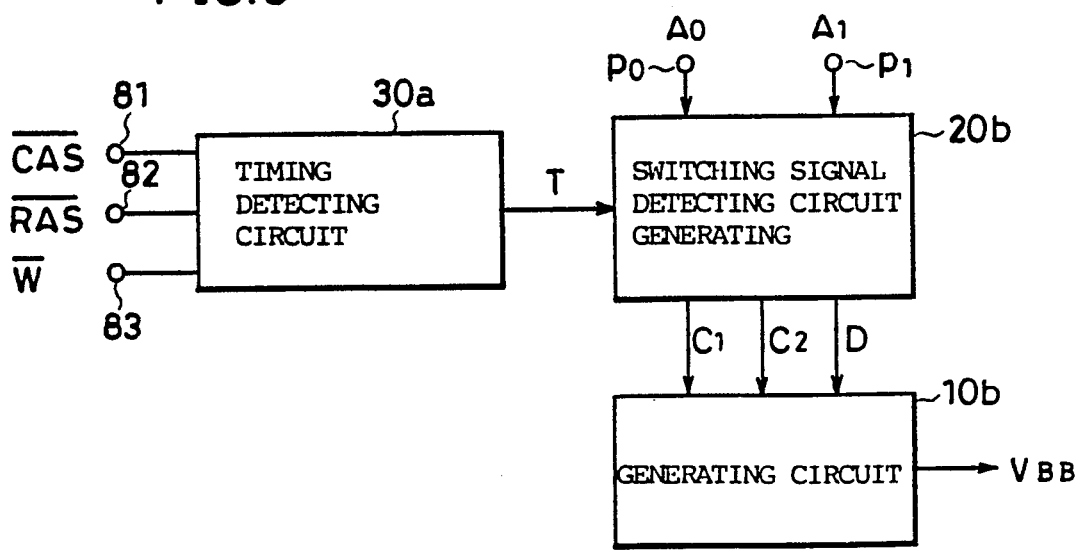

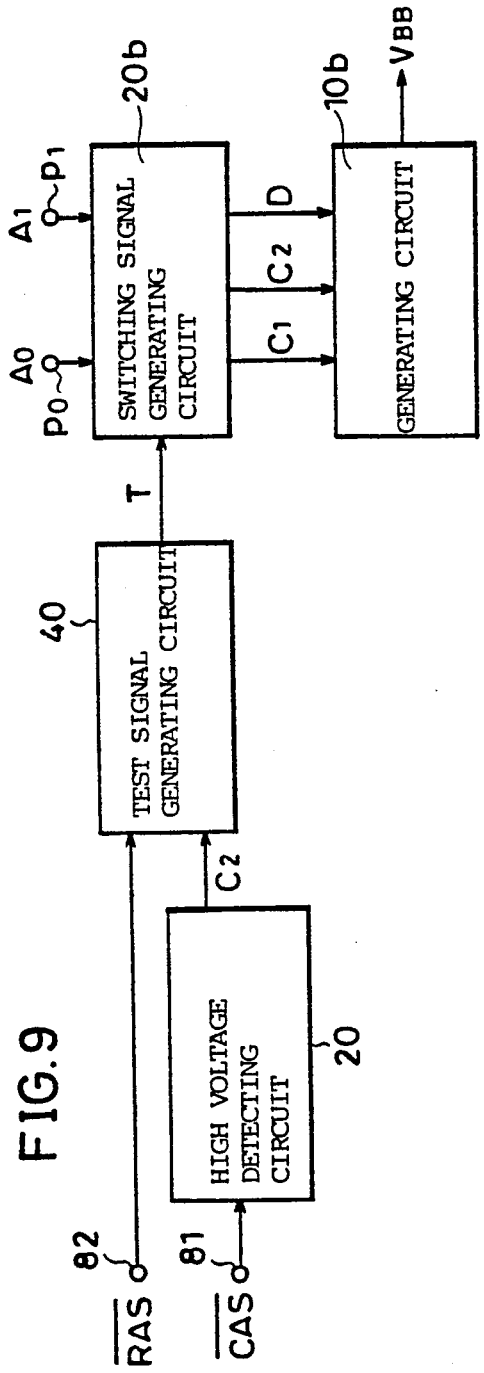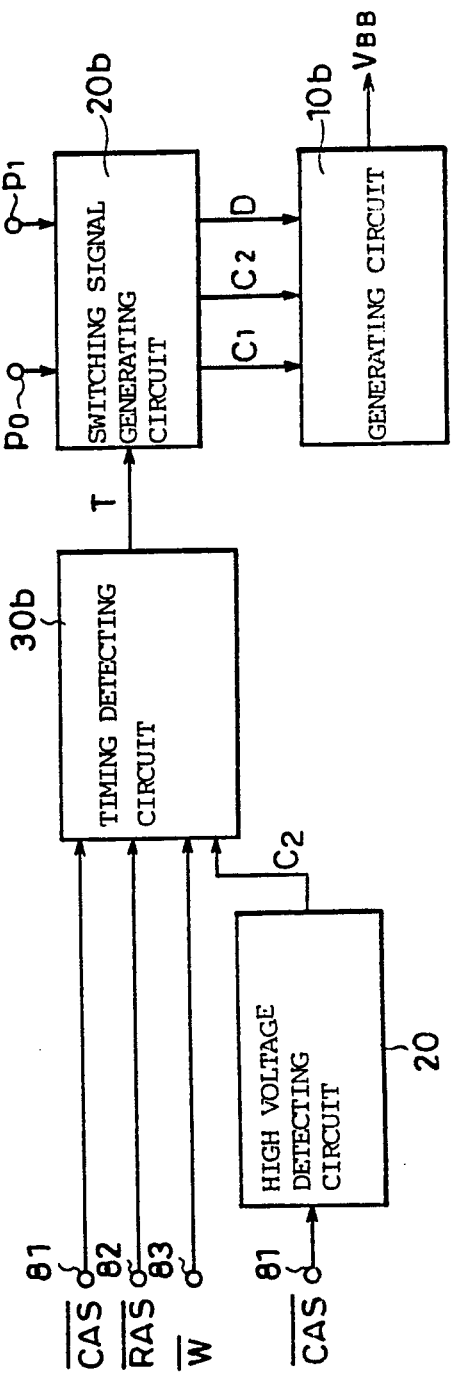

FIG.12

SEMICONDUCTOR INTEGRATED CIRCUIT DEVICE TESTING

BACKGROUND OF THE INVENTION

1. Field of the Invention

The present invention relates generally to testing semiconductor integrated circuit devices, and more particularly, to biasing the substrate of semiconductor integrated circuit devices comprising substrate bias voltage generating circuits.

2. Description of the Background Art

Manufacturers of semiconductor memory devices such as dynamic RAM (referred to as DRAM hereinafter) perform various tests to a completed semiconductor memory device in order to eliminate defective products. Among the various types of test, one of the most simple ones is to read and check data from all memory cells after writing "0" therein then read and check the data from all the memory cells after writing of "1" therein For example, if this test is performed for a DRAM of 4M bit, each test time T1 will be represented as the following equation (1), $$T1 = 4 \times 4 \times 10^6 \times 10 \; \mu sec = 160 \; sec \tag{1}$$

wherein, an initial 4 corresponds to a writing of "0", a reading of "0", writing and reading of "1". The next $4 \times 10^6$ corresponds to a memory capacity. The last 10 μsec corresponds to cycle time and a row address strobe signal $\overline{RAS}$ corresponds to a maximum pulse width. In details, the structure and operation of a conventional DRAM is referred herein to U.S. Pat. No. 3,969,706.

Actually, there are cases in which defective portions cannot be detected only with the above described test. Therefore, other tests are required in which, for example, timing of an input signal, an addressing order of address signals, a pattern of data to be written into a memory cell are changed. However, in some kinds of test, a test time is so long that the test cannot be performed. For example, in a test using a Walking Pattern known as a test approximate to the worst condition (described in Magazine of Articles of Electronic Communication Meeting 1977-12 Vol. J60-D No. 12 pp. 1031-1038), its testing time T2 is extremely long as shown in the following equation (2).

$$\begin{aligned} T2 &\approx 2 \times (\text{memory capacity})^2 \times (\text{cycle time}) \\ &= 2 \times (4 \times 10^6)^2 \times 10 \times 10^{-6} \; sec \\ &= 3.2 \times 10^8 \; sec. = 10.1 \; year \end{aligned} \tag{2}$$

Therefore, it is preferable that defective products be detected in as short a time as possible. The present invention is directed to detecting detective products in as short a time as possible.

Power supply voltage and substrate voltage of a semiconductor device are closely related to whether the device malfunctions or not under a certain condition.

FIG. 1 is a block diagram showing a general structure of a conventional substrate bias voltage generating circuit (referred to as $V_{BB}$ generating circuit hereinafter). In a conventional semiconductor memory device, such a $V_{BB}$ generating circuit is provided in order to attain a high operation speed and stability of an operation. The $V_{BB}$ generating circuit increases an bias of inverse direction applied to an PN junction between a P type semiconductor substrate or a P type well region and an opposite conductivity type (N type) region adjacent thereto, by supplying a fixed amount of negative voltage to the P type semiconductor substrate or the P type well region. Thereby a capacitance on the PN junction of the semiconductor memory device is decreased. As a result, the amount of signals read from the memory cell onto an internal signal line is increased, thereby obtaining high operating speed and a stable operation.

Referring to FIG. 1, a conventional $V_{BB}$ generating circuit is structured by a ring oscillating circuit 1 formed of a plurality of inverter circuits and a charge pump circuit 2 for receiving an output signal $\phi c$ of the ring oscillating circuit 1. The charge pump circuit 2 comprises a charge pumping capacitor 5 for receiving the output signal $\phi c$ of the ring oscillating circuit 1 at one electrode, an N type field effect transistor (referred to as n-FET hereinafter) provided between the other electrode of the charge pumping capacitor 5 and the ground, and an n-FET 4 provided between the other electrode of the charge pumping capacitor 5 and an output terminal 6. The n-FET 3 has a drain and a gate connected to the other electrode of the charge pumping capacitor 5. The n-FET 4 has a drain and a gate connected to the output terminal 6. The n-FETs 3 and 4 have a function as a rectifying element and the charge pump circuit 2 can be regarded as a kind of rectifier circuit. In such a $V_{BB}$ generating circuit, the charge pumping capacitor 5 is charged/discharged by a change of a potential of the output signal $\phi c$ of the ring oscillating circuit 1. More specifically, the substrate side, that is, the output terminal 6 side is charged to a negative potential only when a potential of the output signal $\phi c$ is changed from positive to negative. As the potential change continues, the substrate side is charged to a certain potential value. The value is approximately represented by the following equation (3).

$$V_{BB} = -(V_c - 2V_{THN}) \tag{3}$$

In the equation (3), Vc is a voltage amplitude of the output signal $\phi c$. $V_{THN}$ is a threshold voltage of the n-FETs 3 and 4. Vc is generally set to the same value of the power supply voltage Vcc. Therefore, the power supply voltage Vcc is applied to the ring oscillating circuit 1 through a Vcc power supply terminal 7. In this case, equation (3) will be represented as the following equation (4).

$$V_{BB} = -(Vcc - 2V_{THN}) \tag{4}$$

A $V_{BB}$ line A in FIG. 2 shows a relation of the above equation (4).

As described above, the power supply voltage Vcc and the substrate voltage $V_{BB}$ supplied by the $V_{BB}$ generating circuit are closely related to each other for an operation of the semiconductor memory device. For example, when the power supply voltage Vcc is large and the substrate voltage $V_{BB}$ is small, noise in an internal circuit is increased and a threshold voltage of a transistor in the semiconductor memory device, especially a transistor used in a memory cell is reduced, so that the semiconductor memory device is liable to malfunction. On the contrary, when the power supply voltage Vcc is small and the substrate voltage $V_{BB}$ is large, the amount of charge stored in the memory cell is reduced, which also causes the semiconductor memory device to malfunction. Described in more detail, in a general DRAM, there are cases where bit lines and word lines are coupled to each other due to parasitic capacitances of memory cells to drop voltages ($\Delta V$) on the bit lines (for example, refer to the second paragraph of the third column in U.S. Pat. No. 4,513,399). If a threshold voltage of a transistor in one memory cell becomes smaller than a threshold voltage $V_{TH}$ of transistors in other memory cells due to defects (dusts or the like) in manufacturing, the memory cell is liable to malfunction influenced by $\Delta V$. It is liable to malfunction more often when $V_{cc}$ is larger or $|V_{BB}|$ is smaller, because if $|V_{cc}|$ is larger, $\Delta V$ becomes larger and if $|V_{BB}|$ is smaller, $V_{TH}$ of the memory transistors becomes smaller. The relation is shown as a characteristic curve B in FIG. 2. The characteristic curve B shows a result of operational characteristics of the semiconductor memory device obtained by forcibly applying the substrate voltage $V_{BB}$ from the external, independently of the power supply voltage Vcc. More specifically, the inside of the characteristic curve B is a normal operation region and the the outside thereof is a malfunction region. Accordingly, as long as the substrate voltage $V_{BB}$ is inside the characteristic curve B, the semiconductor memory device operates normally. The characteristic curve B has certain width as shown by a broken line, which indicates that operational characteristics of the semiconductor memory device are changed according to operational conditions of the semiconductor memory device (for example, a timing condition of an input signal, an addressing order of address signals, a data pattern to be written into a memory cell and the like). As described above, a semiconductor memory device is tested under various conditions. Therefore, with different kinds of tests, operational characteristics of the semiconductor memory device are changed within the width of the characteristic curve B shown by the broken lines.

In a normal semiconductor memory device, since a normal operation region is large as shown in FIG. 2, the $V_{BB}$ line A always exists within the normal operation region. Accordingly, the semiconductor memory device always operates normally in any kinds of tests. On the contrary, when threshold voltages of transistors of some memory cells drop extremely due to dusts produced during manufacturing and the like, operational characteristics of the semiconductor memory device are determined by the defective memory cells, so that a configuration of the characteristic curve B is changed. More specifically, the normal operation region is reduced. As a result, as shown in FIG. 3, if the $V_{BB}$ line A is completely outside the characteristic curve B, that is, it is in the malfunction region, the semiconductor memory device malfunctions in any kinds of tests. Accordingly, good products are easily founded.

However, the problem is that when the $V_{BB}$ line A is within the width of the characteristic curve B as shown in FIG. 4. More specifically, in this case, the semiconductor memory device operates normally or malfunctions depending on a kind of test. The reason is that the operational characteristics of the semiconductor memory device are changed within the width of the characteristic curve B as the operational characteristics of the semiconductor memory device differs according to a kind of test. For example, as shown in FIG. 5, if the $V_{BB}$ line A is located closer to the normal operation region than the characteristic curve B1 is, which is obtained in a simple short time test (for example, a test represented by the above described equation (1)), and is located closer to the malfunction region than the operational characteristic curve B2 is, which is obtained by a complicated test of a long time period (for example, a test represented by the above described equation (2)), defective products cannot be found in a simple short time test. As a result, in order to eliminate the defective products, a complicated test should be performed for a long time period, which makes a test time longer.

The present invention is directed to solve the above described problems, and its object is to provide a semiconductor integrated circuit device of which defective products can be eliminated in a simple short time test.

The semiconductor integrated circuit device according to the present invention comprises substrate voltage generating means for generating a voltage to be applied to a semiconductor substrate and wherein a value of the generated voltage is changed in response to a switching of a normal mode to a test mode.

In the present invention, the $V_{BB}$ line is shifted by switching a voltage of the semiconductor substrate in a test mode, thereby causing a semiconductor integrated circuit device having defective characteristics to malfunction even in a simple short time test, so that defective products are easily detected.

The foregoing and other objects, features, aspects and advantages of the present invention will become more apparent from the following detailed description of the present invention when taken in conjunction with the accompanying drawings,

BRIEF DESCRIPTION OF THE DRAWINGS

FIG. 5 is a graph showing a relation between the base voltage $V_{BB}$ and kinds of tests.

FIG. 6 is a block diagram showing a structure of a substrate voltage switching circuit included in a semiconductor memory device according to one embodiment of the present invention.

FIG. 7 is a block diagram showing a structure of a substrate voltage switching circuit included in a semiconductor memory device according to another embodiment of the present invention.

FIG. 8 is a block diagram showing a structure of a substrate voltage switching circuit included in a semiconductor memory device according to a further embodiment of the present invention.

FIG. 9 is a block diagram showing a structure of a substrate voltage switching circuit included in a semiconductor memory device according to still another embodiment of the present invention.

FIG. 10 is a block diagram showing a structure of a substrate voltage switching circuit included in a semiconductor memory device according to a still further embodiment of the present invention.

FIG. 12 is a circuit diagram showing another example of a structure of the $V_{BB}$ generating circuit 10a shown in FIGS. 6 and 7.

DESCRIPTION OF THE PREFERRED EMBODIMENTS

The embodiments of the present invention will be described in detail in reference to the drawings in the . following.

FIG. 6 is a block diagram showing a structure of a substrate voltage switching circuit included in a semiconductor memory device according to one embodiment of the present invention.

In FIG. 6, a high voltage detecting circuit 20 connected to an external terminal 81 for receiving a column address strobe signal $\overline{CAS}$ detects when a high voltage is received to place the memory circuit in a testing mode, an operation of the detecting circuit 20 is described in detail later with reference to FIG. 16. The high voltage detecting circuit 20 causes control signals C1 and C2 to enter a first state (for example, C1="H" (high level), C2="L" (low level)) when a normal voltage is applied to the external terminal 81. In addition, the high voltage detecting circuit 20 causes the control signals C1 and C2 to enter a second state (for example, C1="L", C2="H") when a predetermined high voltage is applied to the external terminal 81. A $V_{BB}$ generating circuit 10a generates a first substrate voltage $V_{BB1}$ when the control signals C1 and C2 are in the first state. In addition, the $V_{BB}$ generating circuit 10a generates a second substrate voltage $V_{BB2}$ when the control signals C1 and C2 are in the second stage and a detailed description of the circuit will be made with reference to FIGS. 11 to 14 later.

Figure 4:
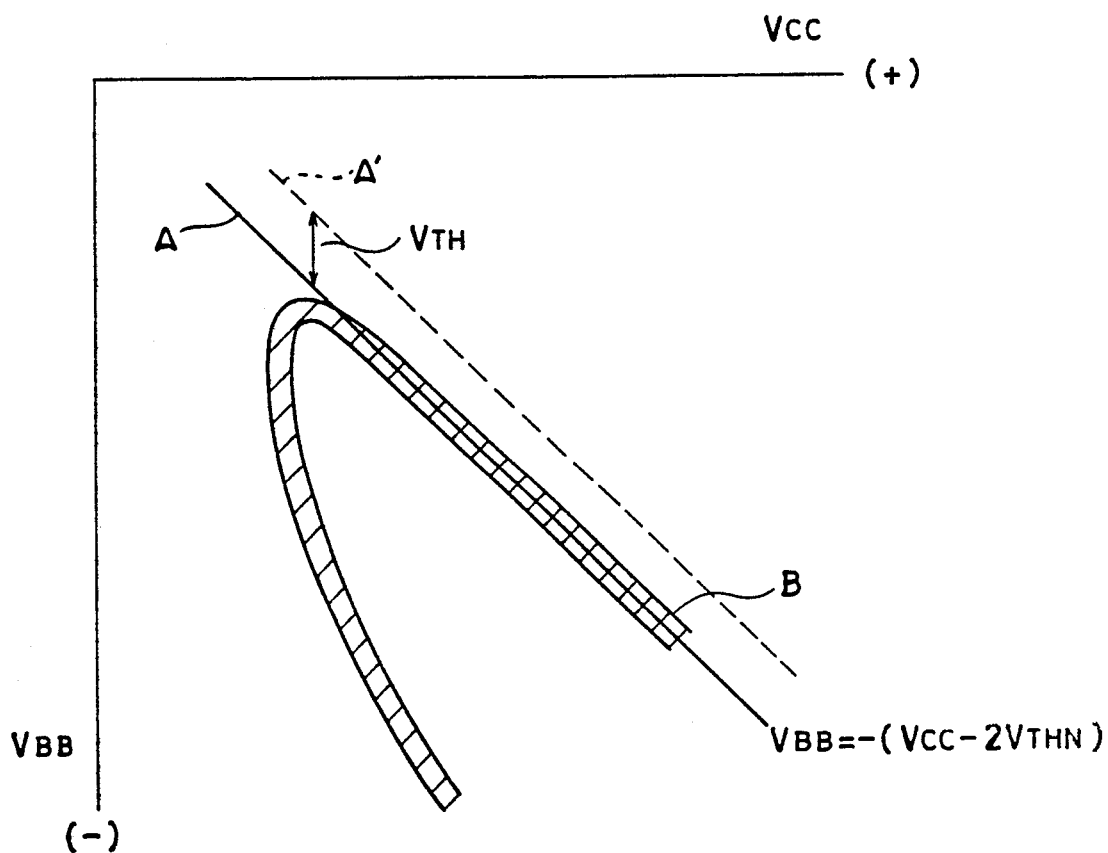

Assuming that the above described first substrate voltage $V_{BB1}$ is on the $V_{BB}$ lines A in FIGS. 4 and 5, and the second substrate voltages $V_{BB2}$ is on the $V_{BB}$ lines A' in FIGS. 4 and 5, if a defective portion exists in the semiconductor memory device, the semiconductor memory device malfunctions even in a test of a short test time period (characteristic curve B1).

Accordingly, by applying a high voltage to the external terminal 81 during a test, it can be easily detected whether the semiconductor memory device has defective characteristics or not.

FIG. 7 is a block diagram showing a structure of a substrate voltage switching circuit included in a semiconductor memory device according to another embodiment of the present invention.

In FIG. 7, a timing detecting circuit 30a is connected to an external terminal 81 provided with a column address strobe signal $\overline{CAS}$, an external terminal 82 provided with a row address strobe signal $\overline{RAS}$, and an external terminal 83 provided with a writing signal $\overline{W}$. The timing detecting circuit 30a generates a test signal T at the detection of the column address strobe signal $\overline{CAS}$, the row address strobe signal $\overline{RAS}$ and the writing signal $\overline{W}$ being applied in a test mode at a predetermined timing different from the normal timing, and a detailed description of the circuit will be made with reference to FIG. 19 later. For example, if the row address strobe signal $\overline{RAS}$ and the writing signal $\overline{W}$ are at the "L" level when the column address strobe signal $\overline{CAS}$ falls to the "L" level, the test signal T is generated.

The test signal T from the timing detecting circuit 30a, and an external address signal A0 through an external terminal p0 are applied to a switching signal generating circuit 20a. The switching signal generating circuit 20a switches the control signals C1 and C2 from the first state to the second state in response to the test signal T when the external address signal A0 is at the "H" level, and a detailed description of the circuit will be made with reference to FIG. 17 later. A $V_{BB}$ generating circuit 10a switches a substrate voltage $V_{BB}$ from $V_{BB1}$ to $V_{BB2}$ in response to the control signals C1 and C2.

While in the embodiment of FIG. 6, a testing operation is practiced when a voltage applied to the external terminal 81 is higher than a voltage of a normal operation in the embodiment of FIG. 7, a testing operation is practiced when timing of the column address strobe signal $\overline{CAS}$ applied to the external terminals 81-83, the row address strobe signal $\overline{RAS}$ and the writing signal $\overline{W}$ different from normal operational timing.

FIG. 8 is a block diagram showing a structure of a substrate voltage switching circuit included in a semiconductor memory device according to a further embodiment of the present invention.

In FIG. 8, the timing detecting circuit 30a is the same as that of the embodiment of FIG. 7. The test signal is applied from the timing detecting circuit 30a, and external address signals A0 and A1 are applied through external terminals p0 and p1, to the switching signal generating circuit 20b. The switching signal generating circuit 20b generates control signals C1 and C2 and D corresponding to the external address signals A0 and A1 in response to the test signal T, and a detailed description of the circuit will be made with reference to FIG. 18 later. A $V_{BB}$ generating circuit 10b changes a substrate voltage $V_{BB}$ three times according to the control signals C1 and C2 and D.

Accordingly, in the embodiment of FIG. 8, a test can be performed with various substrate voltages.

FIG. 9 is a block diagram showing a structure of a substrate voltage switching circuit included in a semiconductor memory device according to a still another embodiment of the present invention.

In FIG. 9, a high voltage detecting circuit 20 is the same as the high voltage detecting circuit 20 shown in FIG. 6. Accordingly, when a high voltage is applied to an external terminal 81, a control signal C2 of the "H"

level is generated. A test signal generating circuit 40 generates a test signal T in response to the control signal C2 from the high voltage detecting circuit 20 when a row address strobe signal $\overline{RAS}$ applied to an external terminal 82 is at the "L" level, and a detailed description of the circuit will be made with reference to FIG. 21 later. A switching signal generating circuit 20b and a $V_{BB}$ generating circuit 10b are the same as the switching signal generating circuit 20b and the $V_{BB}$ generating circuit 10b shown in FIG. 8.

FIG. 10 is a block diagram showing a structure of a substrate voltage switching circuit included in a semiconductor memory device according to a still further embodiment of the present invention.

In FIG. 10, a high voltage detecting circuit 20 is the same as the high voltage detecting circuit 20 shown in FIG. 6. More specifically, when a high voltage is applied to an external terminal 81, the high voltage detecting circuit 20 generates a control signal C2 of the "H" level. A timing detecting circuit 30b generates a test signal T in response to the control signal C2 when timing of a column address strobe signal $\overline{CAS}$, a row address strobe signal $\overline{RAS}$ and a writing signal $\overline{W}$ applied to external terminals 81-83, respectively is different from timing of a normal operation. A switching signal generating circuit 20b and a $V_{BB}$ generating circuit 10b are the same as the switching signal generating circuit 20b and the $V_{BB}$ generating circuit 10b shown in FIG. 8.

The signals $\overline{CAS}$, $\overline{RAS}$ and $\overline{W}$ used in the embodiments shown in FIGS. 6 to 10 are already known in conventional general DRAMs. Please refer to U.S. Pat. No. 3,969,706 regarding how the signals $\overline{CAS}$, $\overline{RAS}$ and $\overline{W}$ are used in a conventional general DRAM.

In general, a test of a semiconductor memory device is performed by a manufacturer. Thus, the semiconductor memory device should be structured so as not to enter a testing operation state easily when used by a user.

On the other hand, in a general semiconductor memory device, in order to increase a package density of elements, the number of external terminals should be minimized. Therefore, it is not preferable to provide a special external terminal for setting the semiconductor memory device in a test operation state. Accordingly, in the embodiments of the present invention, the following method are employed in order to set the semiconductor memory device in a test operation state without providing additional external terminals.

(1) Set a voltage applied to an external terminal to a voltage outside a range of a normal use.

(2) Timing of an input signal applied to an external terminal is set to timing outside a range of a normal use.

(3) (1) and (2) method are combined.

The embodiments of FIGS. 6 and 9 correspond to the method (1), and the embodiments of FIGS. 7 and 8 correspond to the method (2). In addition, the embodiment of FIG. 10 corresponds to the method (3).

Particularly in the embodiment of FIG. 10, the semiconductor memory device is set to a test state only when conditions of both voltage and timing to be applied to an external terminal is provided, such that in a normal use the semiconductor memory device does not easily enter a test state due to an electric noise and the like. Therefore, no testing operation is performed by accident in a normal use.

A circuit structure to generate a control signal for controlling a valve of a generated voltage of a $V_{BB}$ generating circuit is not limited to the structure shown in FIG. 6 to FIG. 10, but may be of other structures as long as they comprise circuits for generating a control signal in response to that a state of a signal applied to an external terminal enters a predetermined state different from that of a normal operation.

Figure 11:
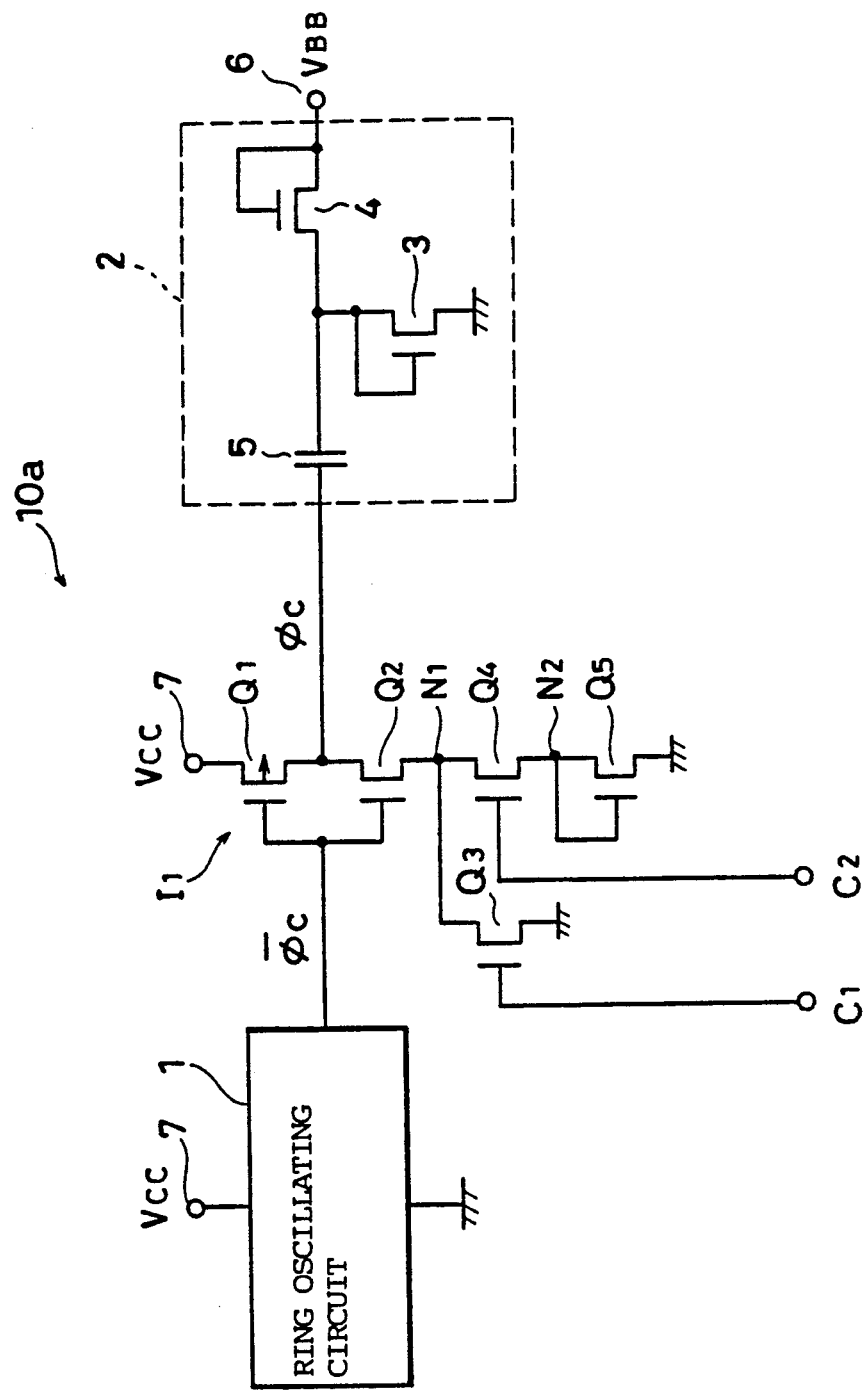
FIG. 11 is a circuit diagram showing an example of a structure of a $V_{BB}$ generating circuit 10a shown in FIGS. 6 and 7.

FIG. 11 is a circuit diagram showing one example of a structure of the $V_{BB}$ generating circuit 10a shown in FIGS. 6 and 7.

Figure 1:
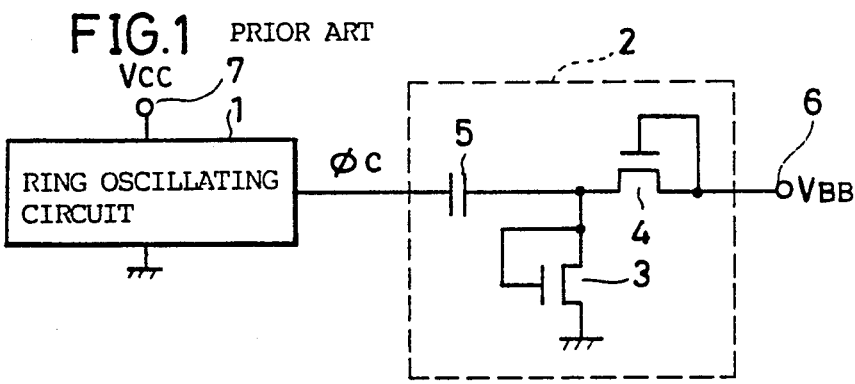
FIG. 1 is a block drawing showing a general structure of a conventional $V_{BB}$ generating circuit.
Figure 2:
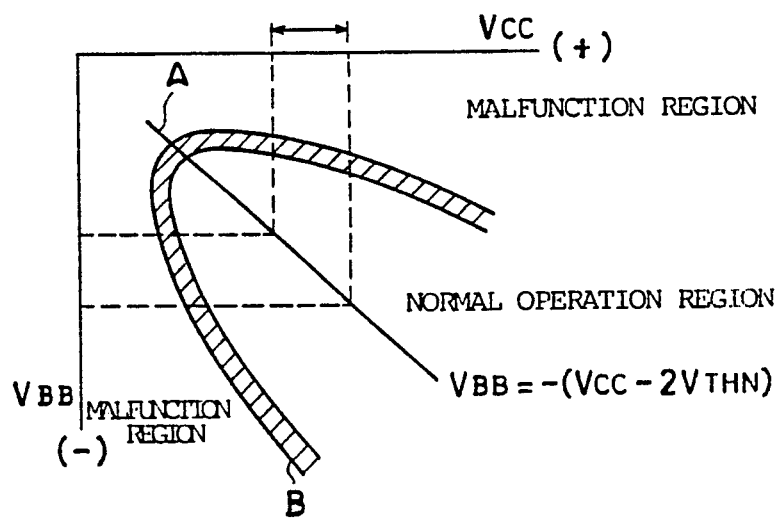
FIGS. 2 to 4 are graphs showing operational characteristics of a semiconductor memory device, related to a substrate voltage $V_{BB}$ and a power supply voltage Vcc.

In FIG. 11, the $V_{BB}$ generating circuit 10a comprises a ring oscillating circuit 1 and a charge pump circuit 2 as a conventional $V_{BB}$ generating circuit shown in FIG. 1. Furthermore, an inverter circuit Il is provided between the ring oscillating circuit 1 and the charge pump circuit 2. The inverter circuit Il comprises a p type field effect transistor (referred to as p-FET hereinafter) Q1 and an n-FETQ2 connected in series between a Vcc power supply terminal 7 and a node N1. An n-FETQ3 is provided between the node N1 and a ground. A control signal C1 is provided to a gate of the n-FETQ3. N-FETsQ4 and Q5 are connected in series between the node N1 and the ground. A control signal C2 is provided to a gate of the n-FETQ4. A gate of the n-FETQ5 is connected to a node N2 which is a connection point between the n-FETQ4 and the n-FETQ5.

Now, operation of the $V_{BB}$ generating circuit shown in FIG. 11 will be described.

In a normal operation, the control signal C1 is at the "H" level and the C2 is at the "L" level. Therefore, the n-FETQ3 is turned on, and the node N1 is grounded. At this moment, when an output signal $\bar{\phi}c$ of the ring oscillating circuit 1 is at the "H" level, that is, a Vcc, the n-FETQ2 is turned to attain a ground level, and on the contrary, when the output signal $\bar{\phi}c$ is at the "L" level, that is, the ground level, the p-FETQ1 is turned on to attain Vcc. Accordingly, an amplitude of the output signal $\phi c$ of the inverter circuit Il becomes Vcc as an amplitude of the output signal $\bar{\phi}c$ of the ring oscillating circuit 1. As a result, a substrate voltage $V_{BB1}$ obtained from an output terminal 6 will be represented as a value represented by the above described equation (4) minus (Vcc−2$V_{THN}$).

On the other hand, during a test the control signal C1 is at the "L" level, and the C2 is at the "H" level. Therefore, the n-FETQ3 is turned off and the n-FETQ4 is turned on. At this moment, a potential of the node N1 is also becomes $V_{THN}$ as a potential of the node N2 is fixed to $V_{THN}$ due to a function of the n-FETQ5. Accordingly, the "H" level of the output signal $\phi c$ of the inverter circuit Il will be Vcc and the "L" level thereof will be $V_{THN}$. As a result, an amplitude of the output signal $\phi c$ will be represented as Vcc−$V_{THN}$, and a substrate voltage $V_{BB2}$ obtained from the output terminal 6 will be a value represented by the following equation (5)

$$V_{BB2} = -(Vcc - 3V_{THN})  \quad (5)$$

More specifically, during a test, an absolute value of the substrate voltage $V_{BB2}$ is reduced by $V_{THN}$ as compared with that of the substrate voltage $V_{BB1}$ during a normal operation. As a result, the $V_{BB}$ line is shifted from A to A' as shown in FIG. 4 or FIG. 5. Accordingly, when defective portions exist in the semiconductor memory device, the semiconductor memory device malfunctions even in a short time period test (the characteristic curve Bl in FIG. 5). Therefore, defective products can be detected easily in a short time test, so that test time can be reduced.

The foregoing is a case in which the absolute value of the substrate voltage $V_{BB2}$ during a test is smaller than that of the substrate voltage $V_{BB1}$ during a normal operation; in some cases, characteristics opposite to those in FIGS. 4 and 5 are shown depending on contents of defects in the products, however. In this case, the absolute value of the substrate voltage $V_{BB2}$ during a test should be made larger than that of the substrate voltage $V_{BB1}$ during a normal operation. The embodiment of this case is shown in FIG. 12.

Figure 12:
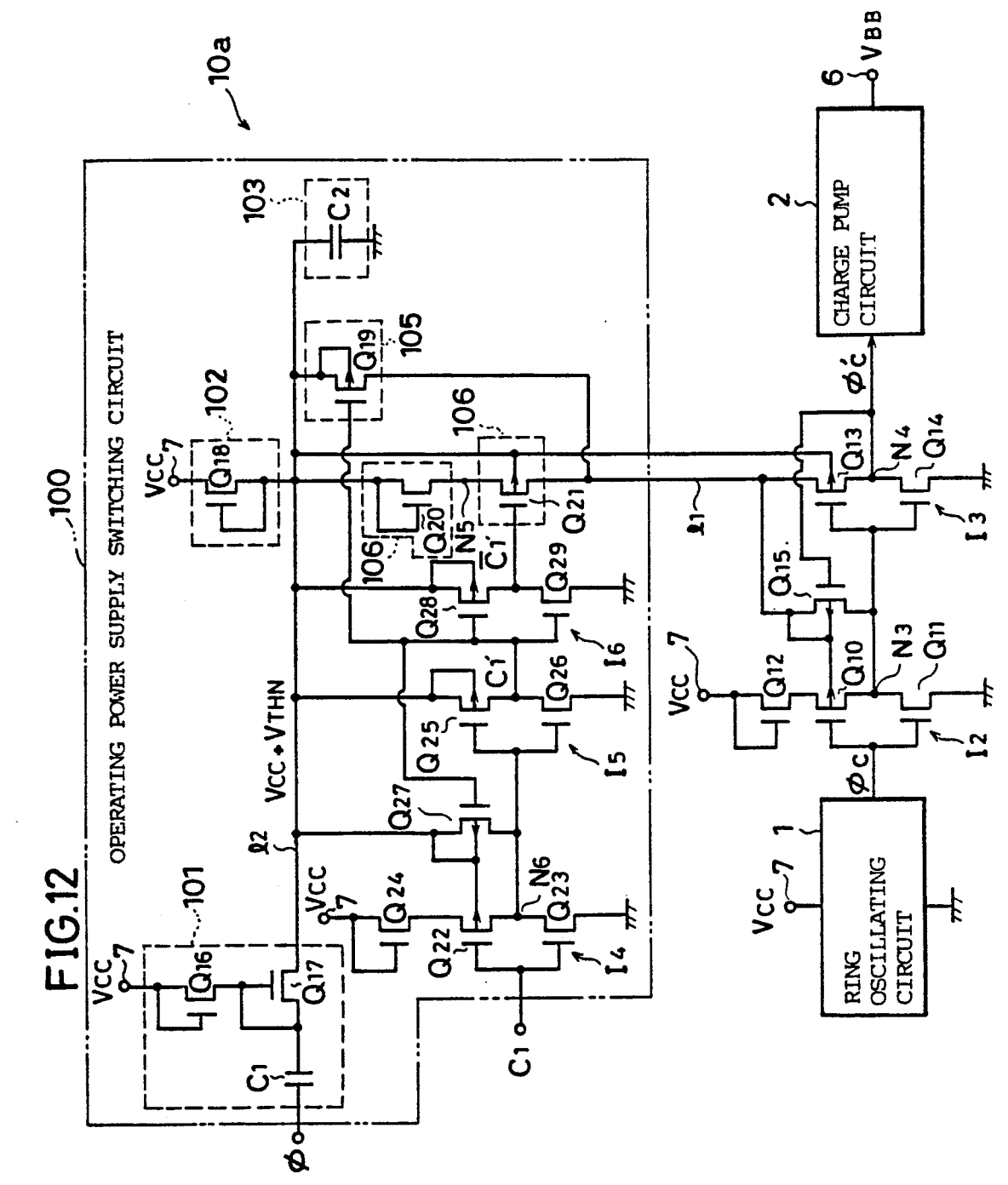

FIG. 12 is a circuit diagram showing another example of a structure of the $V_{BB}$ generating circuit 10a shown in FIGS. 6 and 7.

A $V_{BB}$ generating circuit 10a in FIG. 12 comprises a ring oscillating circuit 1 and a charge pump circuit 2 as the $V_{BB}$ generating circuit shown in FIG. 11. Circuit means is provided between the ring oscillating circuit 1 and the charge pump circuit 2, for switching an amplitude of an output signal $\phi c$ of the ring oscillating circuit 1 in response to a control signal C1. The circuit means comprises two inverter circuits I2 and I3 connected in series between the ring oscillating circuit 1 and the charge pump circuit 2, and an operating power supply switching circuit 100 connected to a higher voltage side of the inverter circuit I3 through a power supply line 11.

The inverter circuit I2 comprises series connected p-FETQ10 and a n-FETQ11. The output signal $\phi c$ of the ring oscillating circuit 1 is applied to gates of the p-FETQ10 and the n-FETQ11. The inverter circuit I2 outputs inversion of the output signal $\phi c$ to an output node N3. Furthermore, an n-FETQ12 is provided between the p-FETQ10 and a Vcc power supply terminal 7. A gate of the n-FETQ12 is connected to the Vcc power supply terminal 7. The inverter circuit I3 comprises a p-FETQ13 and an n-FETQ14 connected in series between the power supply line 11 and a ground. The inverter circuit I3 receives an output signal of the inverter circuit I2 at gates of the p-FETQ13 and the n-FETQ14 and outputs the inverted signal $\phi c'$ thereof to an output node N4. The output signal $\phi c'$ of the inverter circuit I3 is provided to the charge pump circuit 2.

Now, operation of the $V_{BB}$ generating circuit shown in FIG. 12 will be described.

In a normal operation, the control signal C1 applied to the operating power supply switching circuit 100 is at the "H" level. The operating power supply switching circuit 100 supply a voltage of Vcc to the power supply line 11 in response to the control signal C1 of the "H" level. Accordingly, the inverter circuit I3 performs inverting operation using a normal power supply voltage Vcc as an operating power supply. In this case, the output signal $\phi c'$ of the inverter circuit I3 is in the same phase with and has the same amplitude as the output signal $\phi c$ of the ring oscillating circuit 1. Therefore, the substrate voltage $V_{BB1}$ obtained from the output terminal 6 will be represented as the value represented by the above described equation (4) minus (Vcc−2$V_{THN}$).

On the other hand, during a test, the control signal C1 attains the "L" level. The operating power supply switching circuit 100 supplies a voltage of Vcc+$V_{THN}$ to the power supply line 11 in response to the control signal C1 of the "L" level. Accordingly, the inverter circuit I3 performs an inverting operation using a higher voltage by a threshold voltage $V_{THN}$ of the n-FET than the normal power supply voltage Vcc as an operating power supply. When the output signal $\phi c$ of the ring oscillating circuit 1 is at the "L", that is, the ground level, the p-FETQ10 and the n-FETQ14 are turned on, so that the output signal $\phi c'$ of the inverter circuit I3 attains the ground level. Contrarily, when the output signal $\phi c$ of the ring oscillating circuit 1 is at the "H" level, that is, the Vcc, the n-FETQ11 and the p-FETQ13 are turned on, so that the output signal $\phi c'$ of the inverter circuit I3 becomes a supply voltage Vcc+$V_{THN}$ of the power supply line 11. Accordingly, amplitude of the output signal $\phi c'$ during a test will be represented as Vcc+$V_{THN}$. As a result, the substrate voltage $V_{BB2}$ obtained from the output terminal 6 will be represented as a value represented by the following equation (6).

$$V_{BB2} = -(Vcc - V_{THN}) \qquad (6)$$

More specifically, an absolute value of a substrate voltage during a test can be made larger by $V_{THN}$ as compared with that of the substrate voltage in a normal operation, whereby semiconductor memory devices having defective characteristics can be easily detected.

In a test, although the output voltage Vcc of the inverter circuit I2 is applied to the gate of the p-FETQ13 of the inverter circuit I3, when the output signal $\phi c$ of the ring oscillating circuit 1 is at the "L" level, the p-FETQ13 might be undesirably turned on since a source potential of the p-FETQ13 is Vcc+$V_{THN}$ (a potential of the power supply line 11). If the p-FETQ13 is turned on, since the n-FETQ14 is also turned on, a large penetrating current flows from the operating power supply switching circuit 100 to the ground, which causes unnecessary power consumption. In order to prevent it, a p-FETQ15 is provided between the output node N3 of the inverter circuit I2 and the power supply line 11. A gate of the p-FETQ15 is connected to the output node N4 of the inverter circuit I3. More specifically, when the output signal $\phi c$ of the ring oscillating circuit 1 attains the "L" level and correspondingly the output signal $\phi c'$ of the inverter circuit I3 also attains the "L" level, the p-FETQ15 is turned on, causing a potential of the output node N3 to be Vcc+$V_{THN}$. As a result, the p-FETQ13 is turned off, preventing the penetrating current. Although at this time, with the p-FETQ15 being turned on, a current might flow reversely from the power supply line 11 through the p-FETQ15 and the p-FETQ10 toward the Vcc power supply terminal 7, however, such reverse flow is prevented by the n-FETQ12.

Now, the structure and the operation of the operating power supply switching circuit 100 will be described in more detail. Roughly stated, the operating power supply switching circuit 100 comprises three inverter circuits I4, I5 and I6, a high voltage generating circuit 101, a voltage clamp circuit 102, a voltage stabilizing circuit 103, switching elements 104 and 105, and a voltage dropping element 106.

The high voltage generating circuit 101 is comprised of n-FETQs16 and Q17 and a boosting capacitor C1. The high voltage generating circuit 101 is a kind of charge pump circuit and receives a clock pulse $\phi$ at one electrode of the boosting capacitor C1 to generate a high voltage $V_0$. The voltage $V_0$ generated by the high voltage generating circuit 101 will be represented as the following equation (7).

$$V_0 = 2Vcc - 2V_{THN} \qquad (7)$$

wherein $V_{THN}$ is a threshold voltage of the n-FETsQ16 and Q17, and an amplitude of the clock pulse $\phi$ is Vcc. An output of the high voltage generating circuit 101 is applied to a power supply line l2.

The voltage clamp circuit 102 is used for clamping potential of the power supply line l2 to a desired value, and is comprised of an n-FETQ18 provided between the power supply line l2 and a Vcc power supply terminal 7. A gate of the n-FETQ18 is connected to the power supply line l2. If a potential of the power supply line l2 becomes higher than a source potential (Vcc) of the n-FETQ18 by a threshold voltage $V_{THN}$ of the n-FETQ18 due to a function of the high voltage generating circuit 101, the n-FETQ18 is turned on, so that electric charges flow from the power supply line l2 toward the Vcc power supply terminal 7. As a result, the potential of the power supply line l2 is limited to $Vcc+V_{THN}$.

The voltage stabilizing circuit 103 comprises a stabilizing capacitance C2 provided between the power supply line l2 and the ground. The voltage stabilizing circuit 103 is provided for minimizinq deviation of a potential of the power supply line l2 caused by supply of electric charges to the output side of the inverter circuit I2 from the power supply line l2 when the inverter circuit I3 operates.

The switching element 105 is comprised of a p-FETQ19 interposed between the power line l2 and the power supply supply l1. An output signal C1' of the inverter circuit I5 is applied to a gate of the p-FETQ19. The voltage dropping element 106 comprises an n-FETQ20 having a gate and a drain connected to the power line l2. A source of the n-FETQ20 is connected to the switching element 104 through a node N5. The switching element 104 comprises a p-FETQ21 provided between the node N5 and the the power supply line l1. An output signal $\overline{C1}'$ of the inverter circuit I6 is applied to a gate of the p-FETQ21.

The inverter circuits I4, I5 and I6 are connected in series in this order. The inverter circuit I4 of the first stage comprises series connected p-FETQ22 and n-FETQ23 connected A control signal C1 is applied to gates of the p-FETQ22 and the n-FETQ23. An n-FETQ24 for preventing reverse flow is provided between the p-FETQ22 and a Vcc power supply terminal 7. The n-FETQ24 has a reverse flow preventing function as the above described n-FETQ12. The inverter circuit I5 of the middle stage comprises a n-FETQ25 and an n-FETQ26 connected in series between the power line l2 and the ground. Gates of the p-FETQ25 and the n-FETQ26 are connected to an output node N6 of the inverter circuit I4. In addition, a p-FETQ27 is provided between the output node N6 and the power line l2. The output signal C1' of the inverter circuit I5 is applied to a gate of the p-FETQ27. The p-FETQ27 has a function for blocking a penetrating current of the inverter circuit I5 generated due to a difference between the operating power supply (Vcc) of the inverter circuit I4 and the operating power supply ($Vcc+V_{THN}$) of the inverter circuit I5 as the above described p-FETQ15. The inverter circuit I6 of the last stage comprises a p-FETQ28 and an n-FETQ29 connected in series between the power line l2 and the ground. The output signal C1' of the inverter circuit I5 is applied to gates of the p-FETQ28 and the n-FETQ29. As described above, the output signal C1' of the inverter circuit I5 and the output signal $\overline{C1}'$ of the inverter circuit I6 are applied to the switching elements 105 and 106 as switching control signals, respectively.

Since in a normal operation, the control signal C1 is at the "H" level, the output signal C1' of the inverter circuit I5 is at the "H" level ($Vcc+V_{THN}$) and the output signal $\overline{C1}'$ of the inverter circuit I6 attains the "L" level (ground level). Therefore, the p-FETQ19 is turned off and the p-FETQ21 is turned on. At this time, a potential of the node N5 is Vcc, as it is lowered by the threshold voltage $V_{THN}$ of the n-FETQ20 from the potential $Vcc+V_{THN}$ of the power line l2 by means of the n-FeTQ20. Therefore, a voltage of Vcc is supplied to the power supply line l1 through the p-FETQ21.

On the other hand, since the control signal C1 attains the "L" level during a test, the output signal C1' of the inverter circuit I5 attains the "L" level (ground level) and the output signal $\overline{C1}'$ of the inverter circuit I6 attains the "H" level ($Vcc+V_{THN}$). Therefore, the p-FETQ19 is turned on and the p-FETQ28 is turned off. Accordingly, in this case the voltage $Vcc+V_{THN}$ of the power line l2 is directly supplied to the power supply line l1 through the p-FETQ19.

As described above, an operating voltage of the inverter circuit I3 is switched according to an operation mode of the semiconductor memory device by the operating power supply switching circuit 100.

Figure 13:
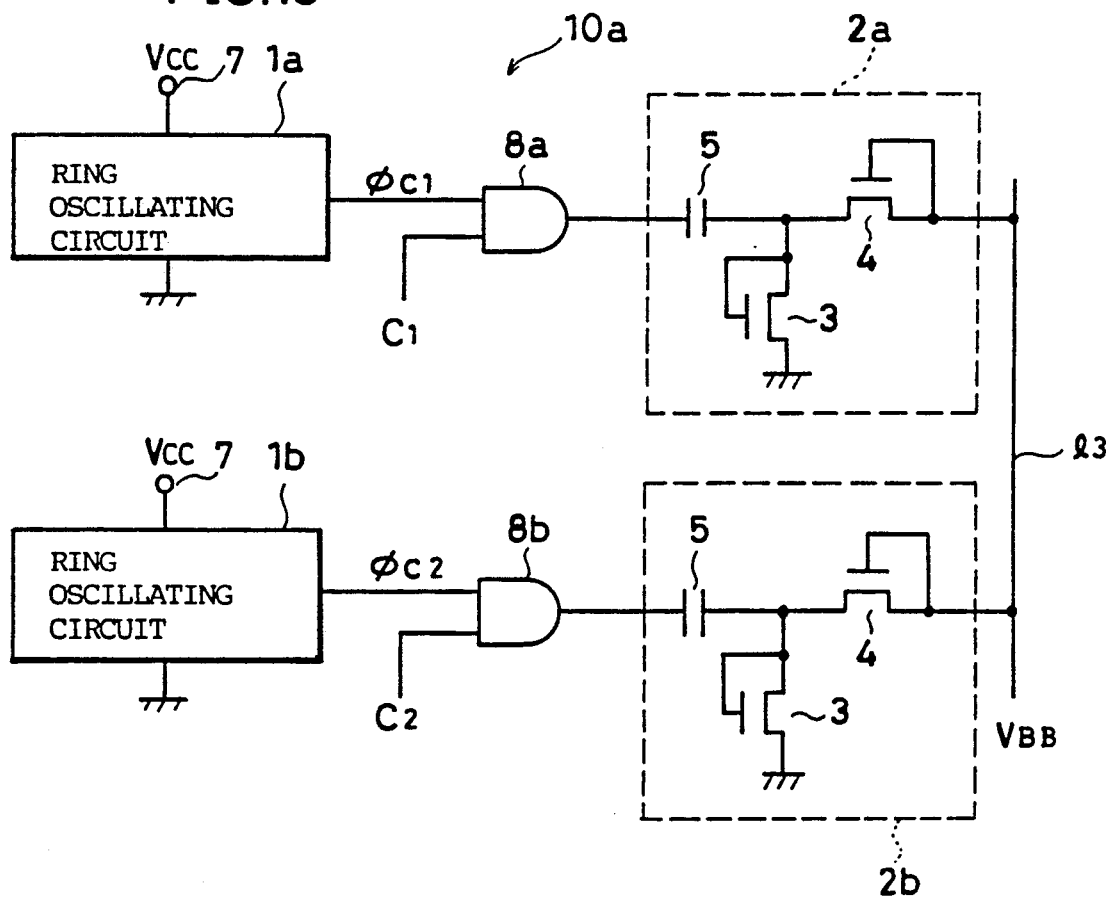
FIG. 13 is a circuit diagram showing a further example of a structure of the $V_{BB}$ generating circuit 10a shown in FIGS. 6 and 7.

FIG. 13 is a circuit diagram showing a further embodiment of a structure of the $V_{BB}$ generating circuit 10a shown in FIGS. 6 and 7.

Two pairs of ring oscillating circuit and charge pump circuit are provided in the $V_{BB}$ generating circuit of FIG. 13. A first ring oscillating circuit 1a outputs an output signal $\phi c_1$ having a "L" level of a ground level and a "H" level of Vcc. The output signal $\phi c_1$ is applied to a first charge pump circuit 2a through an AND gate 8a. A control signal C1 is applied to the AND gate 8a as a switching control signal. A second ring oscillating circuit 1b outputs an output signal $\phi c_2$ having a "L" level of $V_{THN}$ and an "H" level of Vcc. The output signal $\phi c_2$ is applied to a first charge pump circuit 2b through an AND gate 8b. A control signal C2 is applied to the AND gate 8b as a switching control signal. The first charge pump circuit 2a and the second charge pump circuit 2b have respective output terminals coupled to one $V_{BB}$ line 13.

Now, operation of the $V_{BB}$ generating circuit in FIG. 13 will be described. In a normal operation, the control signal C1 is at the "H" level and the control signal C2 is at the "L" level. Therefore, the AND gate 8a is open and the AND gate 8b is closed. Accordingly, only the first charge pump circuit 2a operates after receiving the output signal $\phi c_1$ of the first ring oscillating circuit 1a. Since an amplitude of the output signal $\phi c_1$ is Vcc as described above, the substrate voltage $V_{BB1}$ generated by the first charge pump circuit 2a will be represented as $-(Vcc-2V_{THN})$.

On the other hand, during a test, the control signal C1 attains the "L" level and the control signal C2 attains the "H" level. Therefore, the AND gate 8a is closed and the AND gate 8b is open. Accordingly, only the second charge pump circuit 2b operates after receiving the output signal $\phi c_2$ of the second ring oscillating circuit 1b. Since an amplitude of the output signal $\phi c_2$ is represented as $Vcc-V_{THN}$ as described above, the substrate voltage $V_{BB2}$ generated by the second charge pump 2b will be represented as $-(Vcc-3V_{THN})$.

Figure 3:
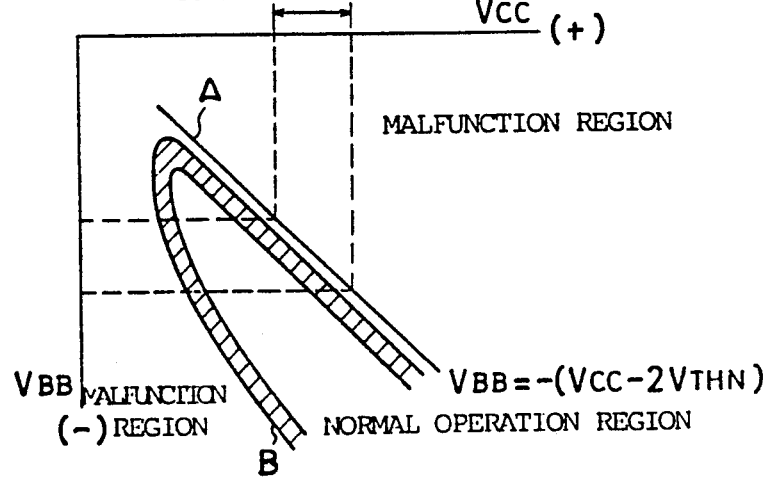

As the foregoing, by providing two pairs of ring oscillating circuit and charge pump, and coupling respective output points to control an operation of a charge pump circuit in each pair by a control signal, two types of substrate voltages $V_{BB}$ can be generated. Although FIG. 3 shows a case in which two types of substrate voltages $V_{BB}$ are generated, it is also possible to generate more types of substrate voltages $V_{BB}$ by increasing the number of ring oscillating circuits and charge pumps, and accordingly the number of control signals.

Figure 14:
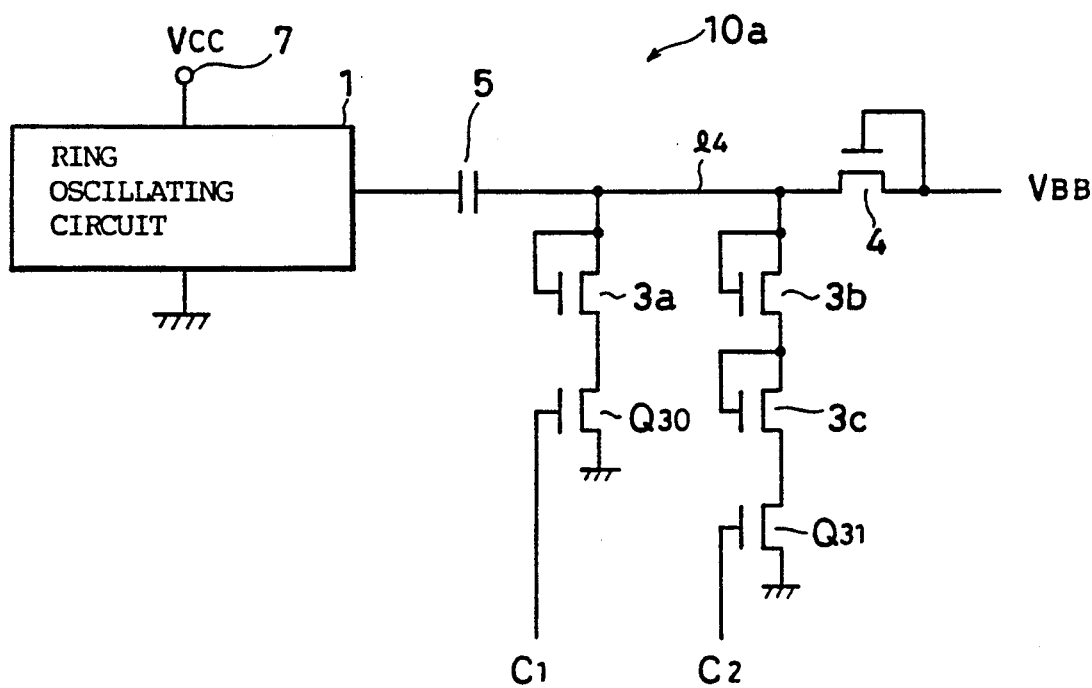
FIG. 14 is a circuit diagram showing still another example of a structure of the $V_{BB}$ generating circuit shown in FIGS. 6 and 7.

FIG. 14 is a circuit diagram showing a still another example of a structure of the $V_{BB}$ generating circuit 10a shown in FIGS. 6 and 7.

In the $V_{BB}$ generating circuit of FIG. 14, two pairs of circuits each comprising serial-connection of transistors are connected to a signal line 14 between a boosting capacitor 5 and an n-FET4 of a charge pump circuit. More specifically, one of the transistor serial-connection circuit comprises n-FETs3a and Q30 connected in series between the signal line 14 and a ground. The n-FET3a has a gate connected to the signal line 14. A control signal C1 is applied to a gate of the n-FETQ30. The other transistor serial-connection circuit comprises n-FETs3b, 3c and Q31 connected in series between the signal line 14 and the ground. The n-FET3b has a gate connected to the signal line 14. The n-FET3C has a gate connected to a junction between the n-FET3b and the n-FET3c. A control signal C2 is applied to a gate of the n-FETQ31.

Now, operation of the $V_{BB}$ generating circuit of FIG. 14 will be described.

In a normal operation, the control signal C1 is at the "H" level and the control signal C2 is at the "L" level. Therefore, the n-FETQ30 is turned on and the n-FETQ31 is turned off. As a result, the operation of the $V_{BB}$ generating circuit 10a will be the same as that of the $V_{BB}$ generating circuit shown in FIG. 1, and a substrate voltage $V_{BB1}$ to be generated will be represented as $-(Vcc - 2V_{THN})$.

On the other hand, during a test, the control signal C1 attains the "L" level and the control signal C2 attains the "H" level. Therefore, the n-FETQ30 is turned off and the n-FETQ31 is turned on. As a result, a potential of the signal line 14 becomes higher by the threshold voltage $V_{THN}$ of the n-FET3c as compared with that of a normal operation due to an effect of the n-FET3c. Accordingly, a substrate voltage generated at this time will be represented as $-(Vcc - 3V_{THN})$.

Although FIG. 14 shows a circuit for generating two types of substrate voltages $B_{BB}$, it is also possible to generate more types of substrate voltages $V_{BB}$ if the number of transistor serial-connection circuits provided between the signal line 14 and the ground is further increased and correspondingly the number of the control signals is increased.

Figure 15:
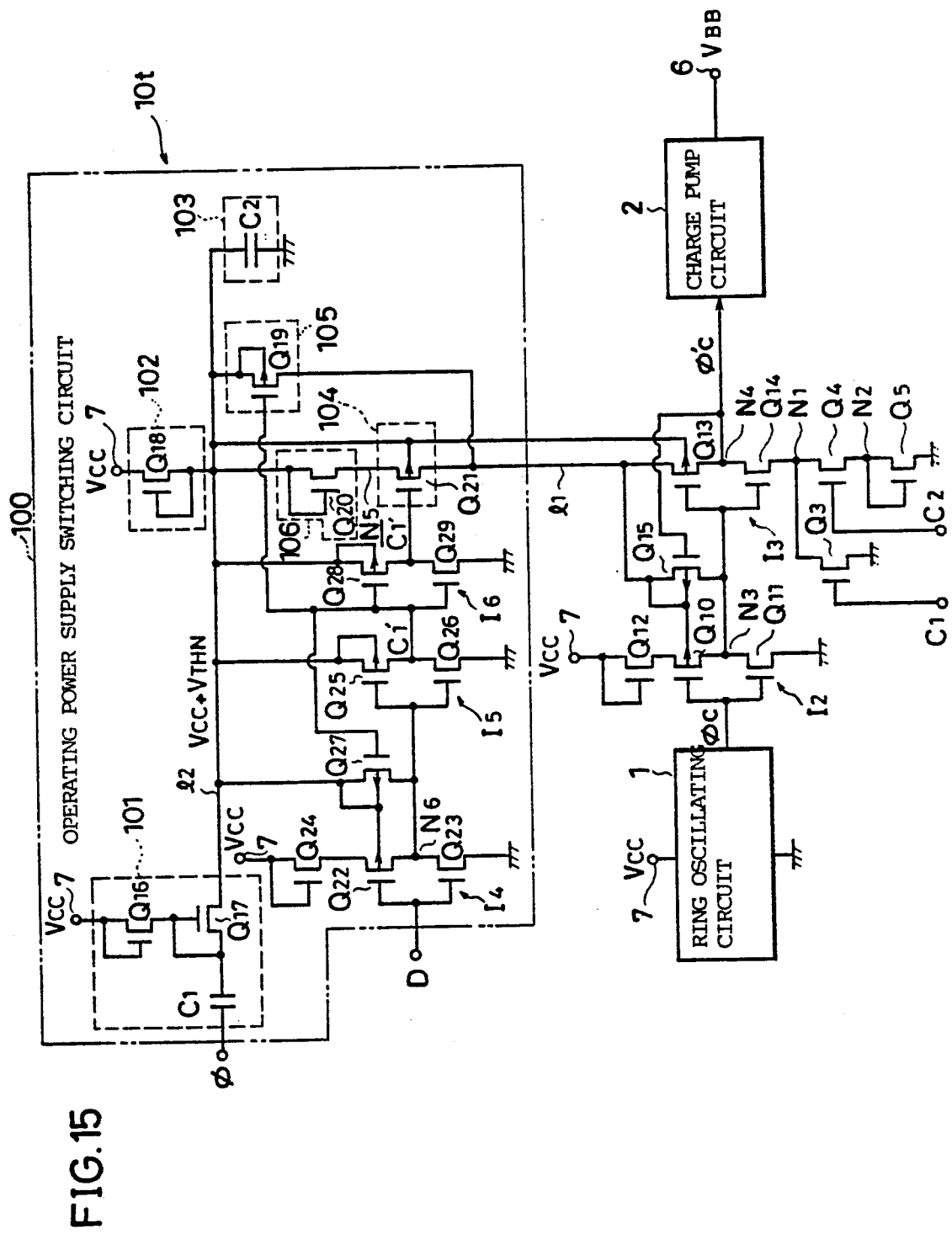
FIG. 15 is a circuit diagram showing one example of a structure of a $V_{BB}$ generating circuit 10b shown in FIGS. 8 to 10.

FIG. 15 is a circuit diagram showing one example of the structure of the $V_{BB}$ generating circuit shown in FIGS. 8 to 10. The $V_{BB}$ generating circuit of FIG. 15 has a structure in which the $V_{BB}$ generating circuit shown in FIG. 11 and the $V_{BB}$ generating circuit shown in FIG. 12 are combined. An operating power supply switching circuit 100 operates in response to the control signal D from the switching signal generating circuit 20b shown in FIGS. 8 to 10. According to the $V_{BB}$ generating circuit of FIG. 15, at least two types of substrate voltages, (a higher substrate voltage and a lower substrate voltage than that of a normal operation) can be generated during a test in response to the control signals C1, C2 and D.

Figure 16:
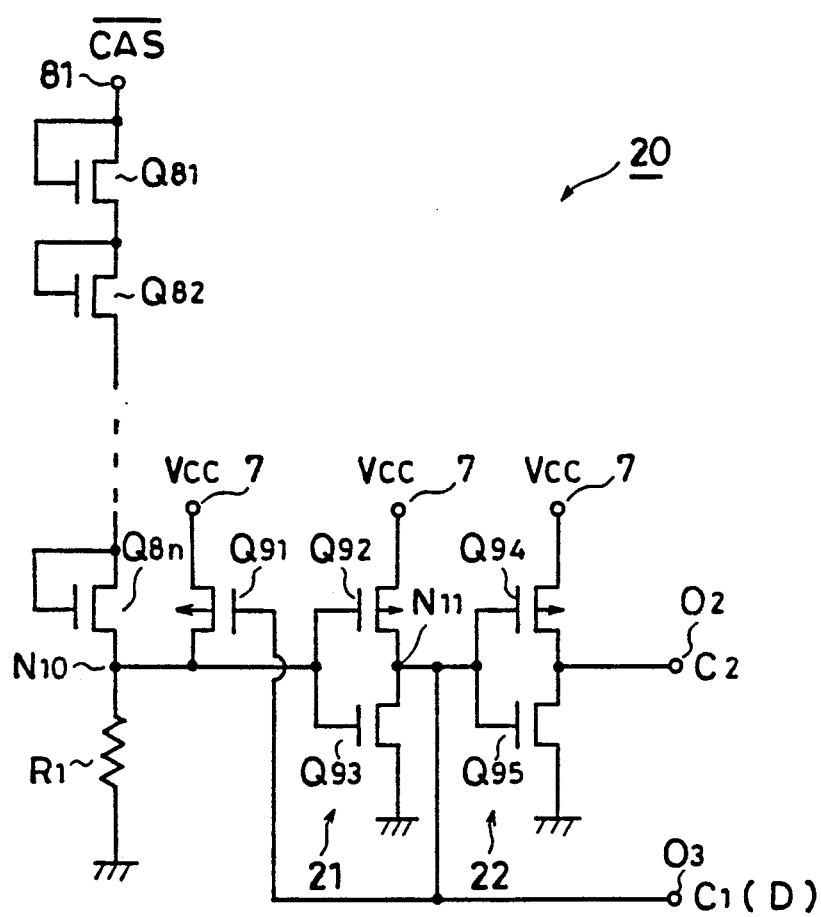
FIG. 16 is a circuit diagram showing one example of a structure of a high voltage detecting circuit 20 shown in FIG. 6, FIG. 9 and FIG. 10.

FIG. 16 is a circuit diagram showing one example of a structure of the high voltage detecting circuit 20 shown in FIG. 6, FIG. 9 and FIG. 10.

In FIG. 16, a plurality of n-FETsQ81-Q8n are connected in series between an external terminal 81 for receiving a column address strobe signal $\overline{CAS}$ and a node N10. Each of n-FETsQ81-Q8n has a gate connected to its drain. The node N10 is grounded through a resistance element R1 having a relatively high resistance value. A p-FETQ91 is connected between the node N10 and a Vcc power supply terminal 7. The node N10 is connected to an output terminal 02 through inverter circuits 21 and 22.

The inverter circuit 21 comprises a p-FETQ92 connected between the Vcc power supply terminal 7 and a node N11, and an n-FETQ93 connected between the node N1 and the ground. The inverter circuit 22 comprises a p-FETQ94 connected between the Vcc power supply terminal 7 and the output terminal 02, and an n-FETQ95 connected between the output terminal 02 and the ground. The node N11 is connected to a gate of the p-FETQ91 and an output terminal 03. A control signal C2 is outputted from the output terminal 02 and a control signal C1 is outputted from the output terminal 03.

Now, operation of the high voltage detecting circuit 20 of FIG. 16 will be described. Assuming that a threshold voltage $V_{THN}$ of an n-FET is 0.5V, the number of n-FETsQ81-Q8n connected between the external terminal 81 and the node N10 is 13, a voltage more than 6.5V (0.5V × 13) should be applied between the external terminal 81 and the node N10 in order to render n-FETQ81-Q8n conductive.

In a semiconductor memory device, a maximum value of a potential of an input signal of the "H" level is defined as 6.5V. In addition, since the node N10 is grounded through the resistance element R1, a potential of the node N10 is usually at the "L" level. Therefore, the p-FETQ92 is turned on, and a potential of the output terminal 03 is at the "H" level. In addition, the n-FETQ95 is turned on and a potential of the output terminal 02 is at the "L" level. Accordingly, the control signal C1 is at the "H" level and the control signal C2 is at the "L" level.

Then, a voltage more than 6.5V is applied to the external terminal 81. For example, when a voltage of 10V is applied to the external terminal 81, a potential of the node N10 will be 3.5V (10V-6.5V), so that the n-FETQ93 is turned on and a potential of the node N11 attains the "L" level. As a result, the p-FETQ94 is turned on and a potential of the output terminal 02 is raised to the power supply potential Vcc, accordingly, the control signal C1 attains the "L" level and the control signal C2 attains the "H" level.

With the control signal C1 attaining the "L" level, the p-FETQ91 is turned on. Therefore, once a high voltage is applied to the external terminal 81, the p-FETQ91 holds states of the control signals C1 and C2 even when no additional high voltage is applied. More specifically, during a test, the column address strobe signal $\overline{CAS}$ is added in a pulsive manner to the external terminal 81, and a testing state is held even if the voltage becomes 0V.

On the contrary, in order to release the testing state, a power supply supplied to the semiconductor memory device is once turned off and a voltage applied to the Vcc power supply terminal 7 is lowered to 0V, whereby a potential of the node N10 becomes a ground potential, so that a normal operation becomes possible.

Although in the circuit of FIG. 16, the external terminal 81 for receiving the address strobe signal $\overline{CAS}$ is used as an external terminal to which a high voltage is applied, other external terminals such as the external terminal 83 for receiving the writing signal $\overline{W}$ may be employed.

Figure 17:
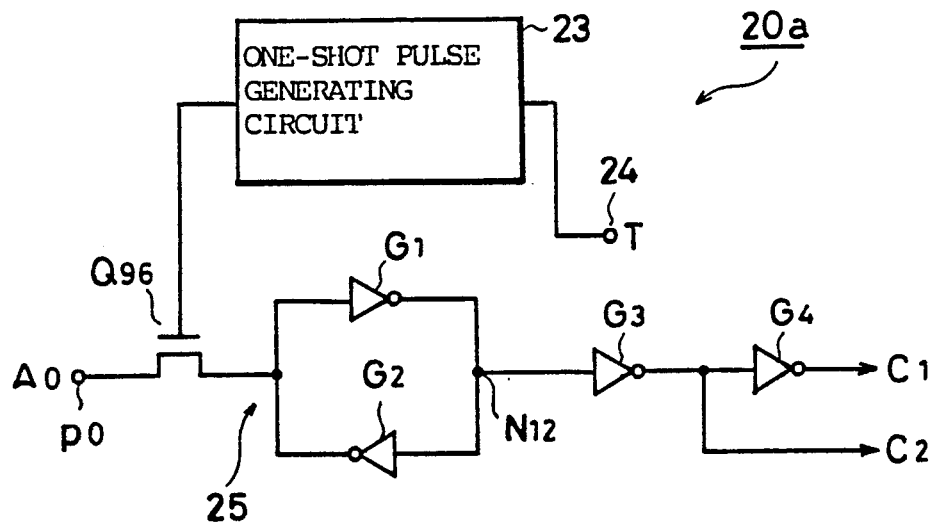
FIG. 17 is a circuit diagram showing one example of a structure of a switching signal generating circuit 20a shown in FIG. 7.

FIG. 17 is a circuit diagram showing one example of a structure of the switching signal generating circuit 20a shown in FIG. 7.

The switching signal generating circuit 20a comprises an n-FETQ96, inverter circuits G1-G4 and an 1-shot pulse generating circuit 23. The 1-shot pulse generating circuit 23 detects a change of a test signal T provided to an input terminal 24 from the "L" level to the "H" level so as to generate an 1-shot pulse of a positive polarity. The inverter circuits G1 and G2 constitute a latch circuit.

In a normal operation, the test signal T is at the "L" level, so that an output of the 1-shot pulse 23 attains the "L" level, and the n-FETQ96 is non-conductive. As a result, an address signal A0 applied to an external terminal p0 is not inputted to a latch circuit 25. In addition, a node N12 is initialized to the "H" level upon the application of the power supply. Therefore, a potential of the node N12 is fixed to the "H" level by the latch 25. As a result, a control signal C2 outputted from the inverter circuit G3 attains the "L" level and a control signal C1 outputted from the inverter circuit G4 attains the "H" level. During a test, the test signal T changes from the "L" level to the "H" level whereby an 1-shot pulse is generated from the 1-shot pulse generating circuit 23, so that the n-FETQ96 is rendered conductive during a fixed time period. As a result, the address signal A0 applied to the external terminal p0 is taken into the latch circuit 25 and latched. Accordingly, when the address signal A0 is at the "H" level, a potential of the node N12, the control signal C2, and the control signal C1 attain the "L" level, the "H" level and the "L" level, respectively. On the contrary, when the address signal A0 is at the "L" level ("0"), the control signal C2 attains the "L" level and the control signal C1 attains the "H" level.

Figure 18:
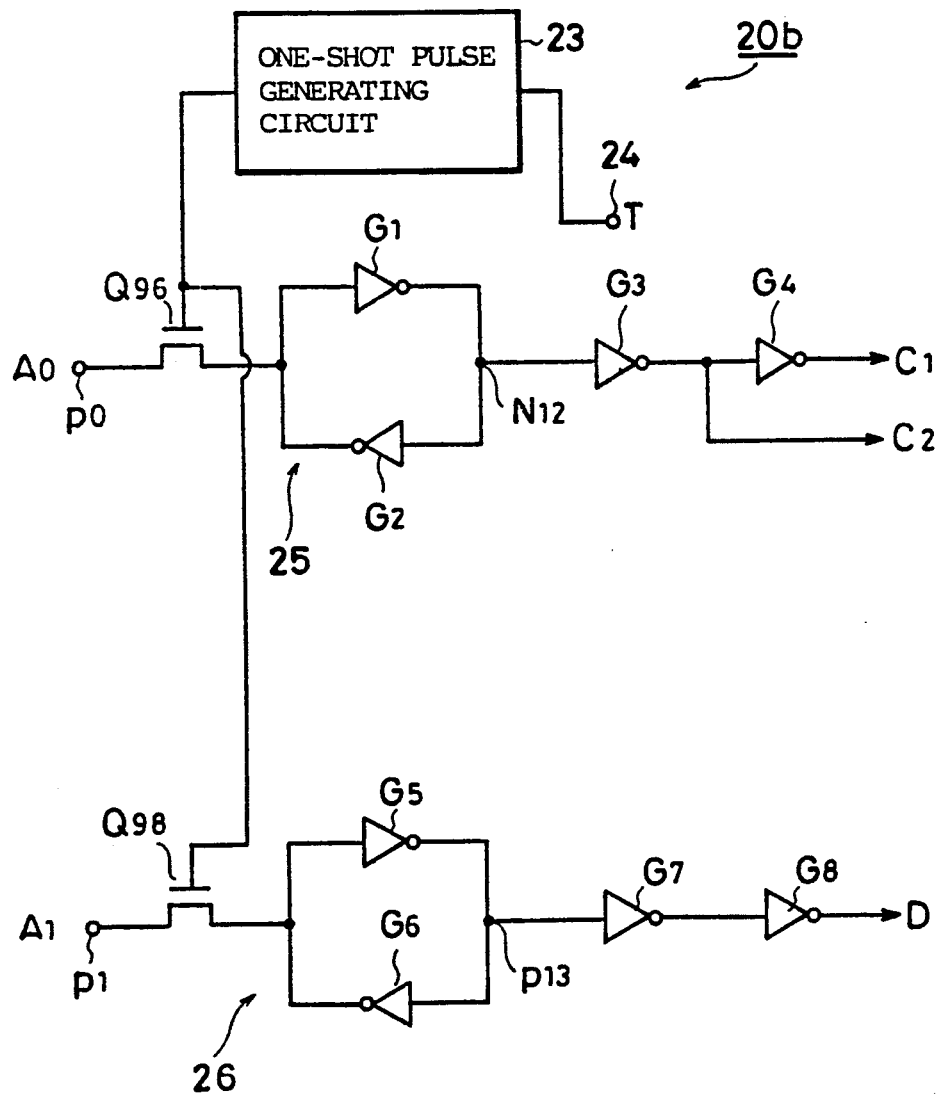
FIG. 18 is a circuit diagram showing one example of a structure of a switching signal generating circuit 20b shown in FIG. 8 to FIG. 10.

FIG. 18 is a circuit diagram showing one embodiment of a structure of the switching signal generating circuit 20b shown in FIG. 8 to FIG. 10.

An n-FETQ98, a latch circuit 26, and inverter circuits G7 and G8 are further provided in the switching signal generating circuit 20b of FIG. 18. The latch circuit 26 is comprised of inverter circuits G5 and G6. Other parts of the switching signal generating circuit 20b are the same as those of the switching signal generating circuit 20a of FIG. 17.

In a normal operation, the test signal T is at the "L" level, so that the n-FETsQ96 and Q98 are turned off. In addition, the nodes N12 and N13 are initialized to the "H" level when the power supply is applied. As a result, potentials of the nodes N12 and N13 are fixed to the "H" level by the latches 25 and 26, so that the control signals C1 and D attain the "H" level and the control signal C2 attains the "L" level. Accordingly, in the $V_{BB}$ generating circuit of FIG. 5, the n-FETQ3 is turned on and the n-FETQ4 is turned off, and the operating power supply switching circuit 100 supplies a normal power supply voltage Vcc to the power supply line 11. As a result, an amplitude of the output signal $\phi c'$ of the inverter circuit I2 becomes the same as that of the output signal $\phi c$ of the ring oscillating circuit 1, and the charge pump circuit 2 generates the subtract voltage $V_{BB1}$ represented as $-(Vcc - 2V_{THN})$.

During a test, the test signal T attains the "H" level, so that the address signal A0 applied to the external terminal p0 is taken into the latch circuit 25 and the address signal A1 applied to the external terminal p1 is taken into the latch circuit 26, whereby, when the address signal A0 is at the "H" level and the address signal A1 is at the "L" level, the control signal C1 attains the "L" level and the control signals C2 and D attains the "H" level. Accordingly, in the $V_{BB}$ generating circuit of FIG. 15, the n-FETQ3 is turned off and the n-FETQ4 is turned on, so that a potential of the node N1 becomes $V_{THN}$. The operating power supply switching circuit 100 supplies a normal power supply voltage Vcc to the power supply line 11, causing a "L" level of the output signal $\phi c'$ of the inverter circuit I2 to be $V_{THN}$ and the charge pump circuit 2 to generate a substrate voltage $V_{BB2}$ represented as $-(Vcc - 3V_{THN})$. On the other hand, when the address signal A0 is at the "L" level and the address signal A1 is at the "H" level, the control signal C1 attains the "H" level and the control signals C2 and D attain the "L" level. As a result, in FIG. 15, the n-FETQ3 is turned on and the n-FETQ4 is turned off, so that a potential of the node N1 becomes a ground potential. In addition, the operating power supply switching circuit 100 supplies a voltage represented as $(Vcc + V_{THN})$ to the power supply line 11, which causes a "H" level of the output signal $\phi c'$ of the inverter circuit I2 to be represented as $Vcc + V_{THN}$ and the charge pump circuit 2 to generate a substrate voltage $V_{BB3}$ represented as $-(Vcc - V_{THN})$.

As the foregoing, during a test, a substrate voltage $V_{BB}$ can be switched into two different voltage from a substrate voltage of a normal operation by using the switching signal generating circuit 20b of FIG. 18 and the $V_{BB}$ generating circuit 10b of FIG. 15.

Figure 19:
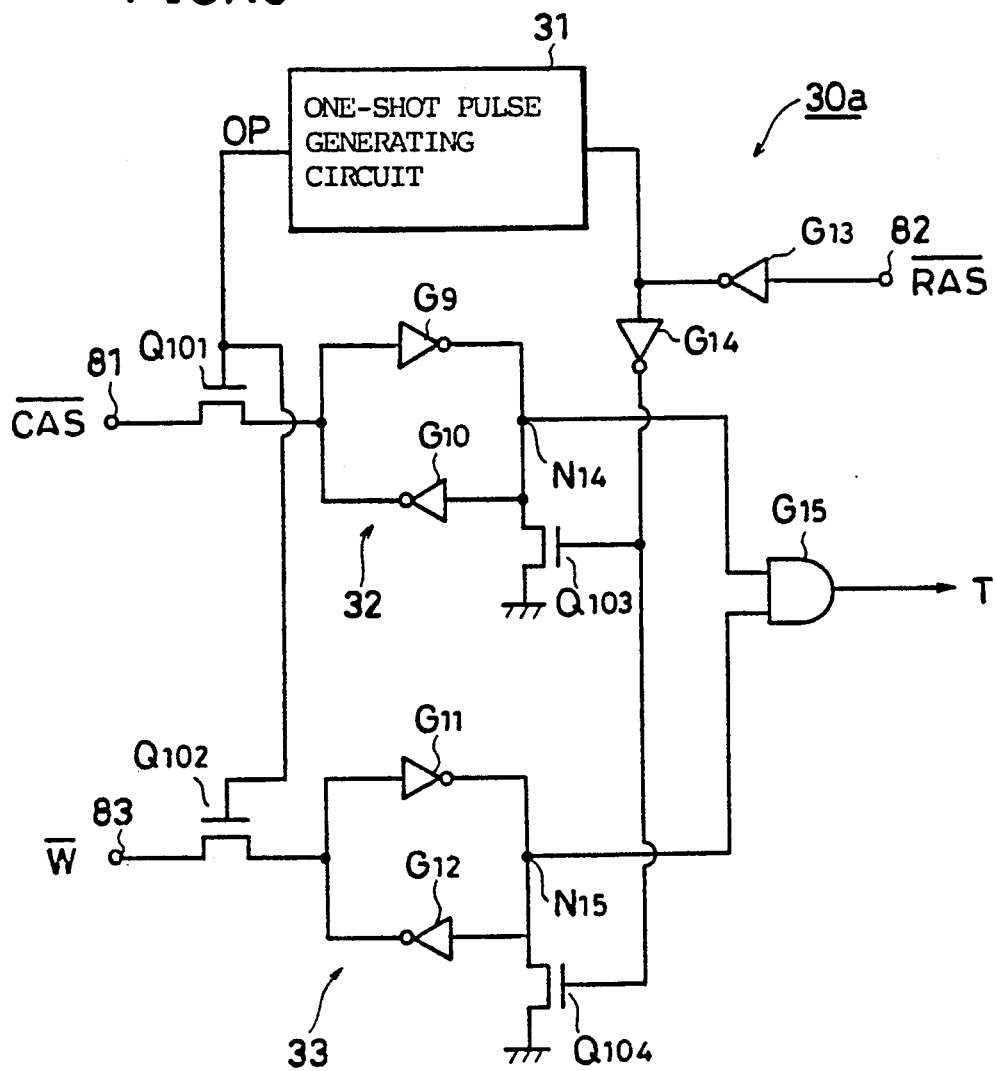
FIG. 19 is a circuit diagram showing one example of a structure of a timing detecting circuit 30a shown in FIGS. 7 and 8.

FIG. 19 is a circuit diagram showing one example of a structure of the timing detecting circuit 30a shown in FIGS. 7 and 8.

The timing detecting circuit 30a of FIG. 19 comprises n-FETsQ101-Q104, inverter circuits G19-G14, and AND gate G15 and an 1-shot pulse generating circuit 31. The inverter circuits G9 and G10 constitute a latch circuit 32, and the inverter circuits G11 and G12 constitute a latch circuit 33. The latch circuit 32 is connected to an external terminal 81 for receiving a column address strobe signal $\overline{CAS}$ through the n-FETQ101. The latch circuit 33 is connected to an external terminal 83 for receiving a writing signal $\overline{W}$ through the n-FETQ102. A row address strobe signal $\overline{RAS}$ is inputted to the 1-shot generating circuit 31 through an external terminal 82 and the inverter circuit G13.

Now, operation of the timing detecting circuit 30a of FIG. 19 will be described.

When the row address strobe signal $\overline{RAS}$ applied to the external terminal 82 falls to the "L" level, an 1-shot pulse OP is generated from the 1-shot pulses generating circuit 31, so that the n-FETsQ101 and Q102 are turned on. As a result, the column address strobe signal $\overline{CAS}$ and the writing signal $\overline{W}$ applied to the external terminals 81 and 83, respectively, are taken into the latch circuits 32 and 33.

Figure 20A:
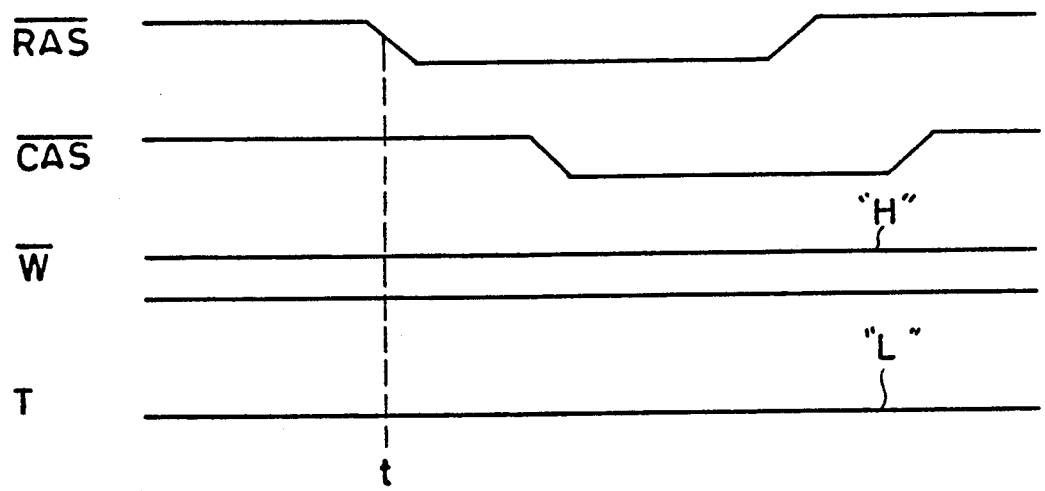
FIG. 20A is a timing chart for explaining timing of a signal in a normal operation.

As shown in FIG. 20A, in a normal operation the column address strobe signal $\overline{CAS}$ and the writing signal $\overline{W}$ are at the "H" level, at the time point t where the row address strobe signal $\overline{RAS}$ falls to the "L" level.

Therefore, potentials of the node N14 and N15 attain the "L" level and a test signal T of the "L" level is outputted from the AND gate G15.

Figure 20B:
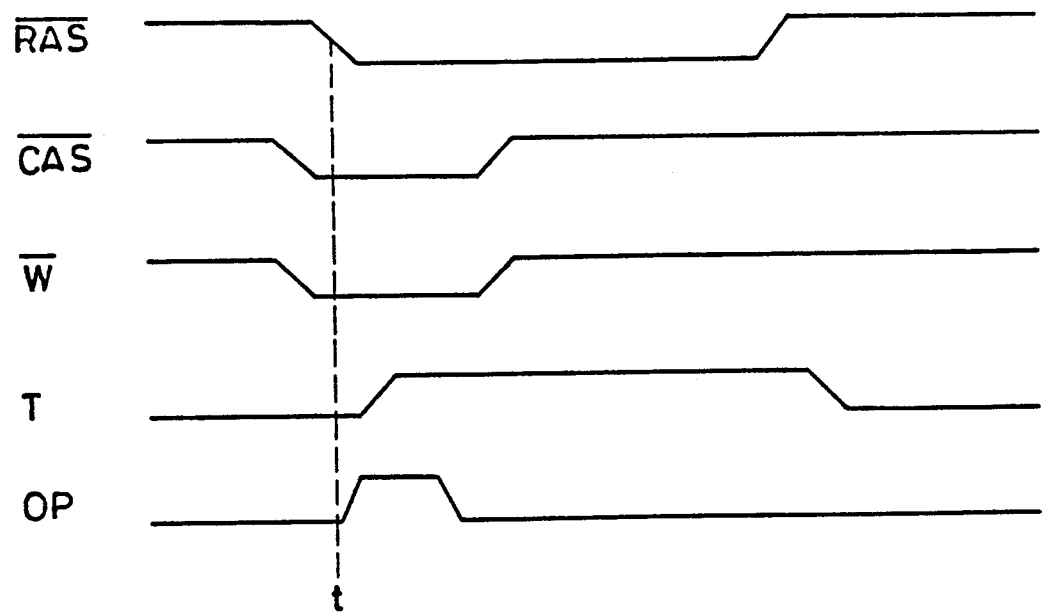
FIG. 20B is a timing chart for explaining timing of a signal during a test.

As shown in FIG. 20B, during a test the column address strobe signal $\overline{CAS}$ and the writing signal $\overline{W}$ are set to the "L" level, at the time point t where the row address strobe signal $\overline{RAS}$ falls to the "L" level. Therefore, if the column address strobe signal $\overline{CAS}$ and the writing signal $\overline{W}$ are taken into the latch circuits 32 and 33, respectively, due to generation of the 1-shot pulse OP, the potentials of the nodes N14 and N15 attain the "H" level. As a result, the test signal T of the "H" level is generated from the AND gate G15. The test signal T is applied to the switching signal generating circuit 20a and the switching signal generating circuit 20b.

Figure 21:
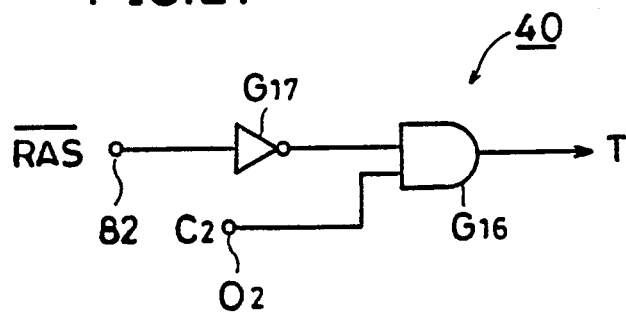
FIG. 21 is a timing chart for explaining timing of a structure of a test signal generating circuit 40 shown in FIG. 9.

FIG. 21 is a circuit diagram showing one embodiment of a structure of the test signal generating circuit 40 shown in FIG. 9.

In FIG. 21, one input terminal of an AND gate G16 is connected through an inverter circuit G17 to an external terminal 82 for receiving a row address strobe signal $\overline{RAS}$. The other input terminal of the AND gate G16 is connected to the output terminal 02 of the high voltage detecting circuit 20 shown in FIG. 16. In a test signal generating circuit 40 of FIG. 21, a test signal T of the "H" level is generated only when the row address strobe signal $\overline{RAS}$ attains the "L" level, and the control signal C2 applied from the high voltage detecting circuit 20 attains the "H" level.

Figure 22:
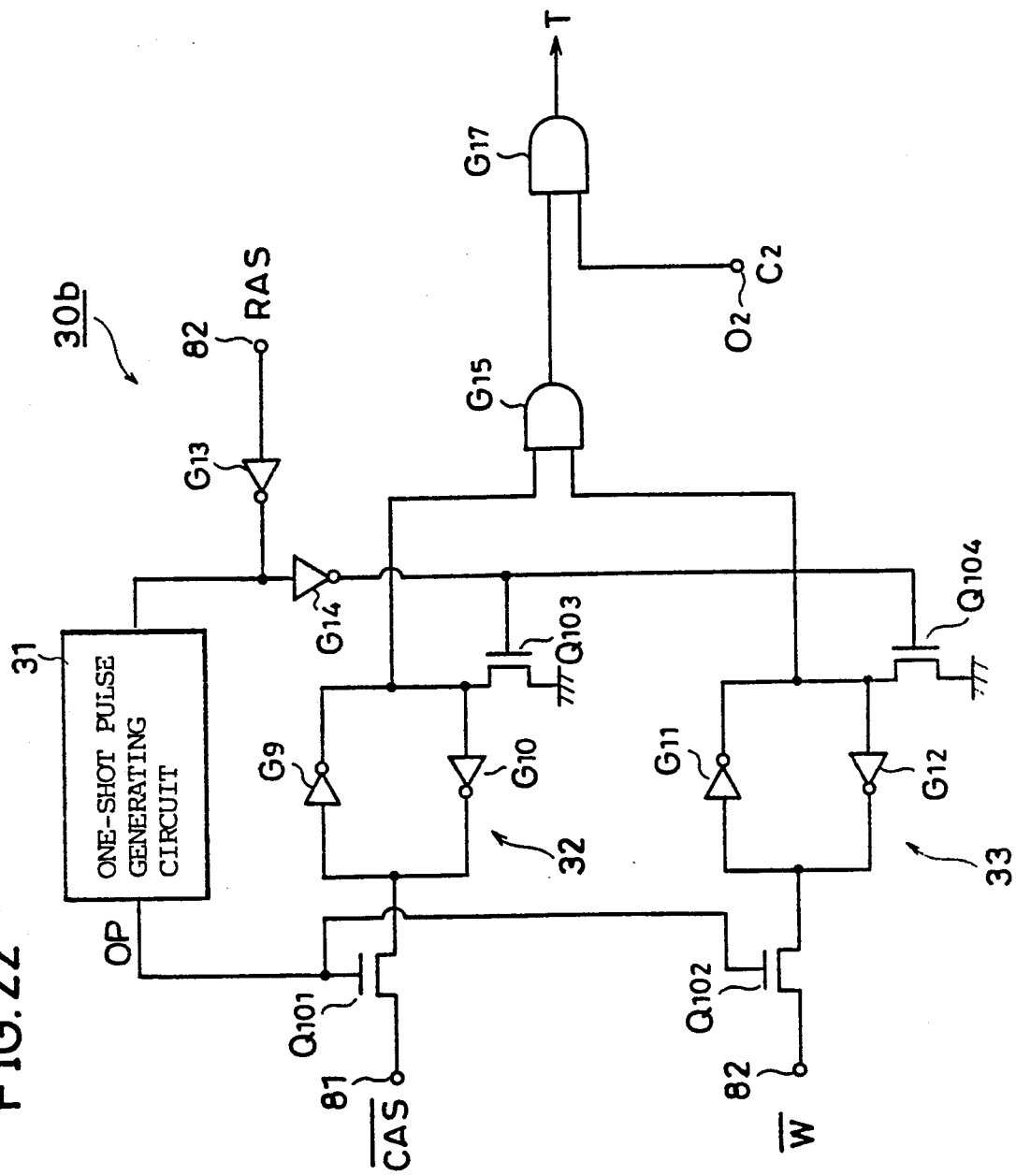
FIG. 22 is a circuit diagram showing one example of a structure of a timing detecting circuit 30b shown in FIG. 10.

FIG. 22 is a circuit diagram showing one example of a structure of the timing detecting circuit 30b shown in FIG. 10.

The timing detecting circuit 30b of FIG. 22 is the same as the timing detecting circuit 30a of FIG. 19 except that an AND gate G17 is provided in the circuit 30b. One input terminal of the AND gate G17 is connected to the output terminal of the AND gate G15, and the other input terminal of the AND gate G17 is connected to the output terminal 02 of the high voltage detecting circuit 20 shown in FIG. 16.

In the timing detecting circuit 30b of FIG. 22, the column address strobe signal $\overline{CAS}$ and the writing signal $\overline{W}$ are at the "L" level during the fall of the row address strobe signal $\overline{RAS}$, and the test signal T of the "H" level is generated only when the control signal C2 applied from the high voltage detecting circuit 20 is at the "H" level.

Although in the above described embodiments, an input terminal is used as an external terminal for setting a semiconductor memory device to a testing state, an input/output terminal or an output terminal may be used.

In the foregoing, although application of the substrate voltage switching circuit shown in FIG. 6 to FIG. 10 to the semiconductor memory device has been described, the present invention is applicable to other circuits of an integrated circuit device formed on a semiconductor substrate.

As the foregoing, according to the present invention, since a substrate voltage can be switched, in a test mode, into a voltage different from that of a normal operation, it is possible to make a semiconductor integrated device to malfunction easily. As a result, defective products can be detected in a short time test, resulting in a reduction of a test time.

In the above described embodiments, while the voltage $V_{BB}$ is applied to the substrate itself, the voltage $V_{BB}$ may be applied to a well for example, in the CMOS structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device formed of various circuits integrated on a semiconductor substrate, comprising:

substrate voltage generating means for generating a voltage to be applied to said semiconductor substrate, and a value of said generated voltage changing in response to at least an operational mode of said semiconductor integrated circuit device being switched from a normal mode to a test mode, external terminals for inputting signals for operating said semiconductor integrated circuit device in said normal mode or said test mode, and test signal generating means for generating a test signal in response to an application of said signals, of a different state than that for said normal mode, for operating said semiconductor integrated circuit device in said test mode, wherein voltage generated by said substrate voltage generating means is changed in response to said test signal.

2. A semiconductor integrated circuit device according to claim 1, wherein
   said substrate voltage generating means generates, in said test mode, a voltage higher than that of said normal mode.

3. A semiconductor integrated circuit device according to claim 1, wherein
   said substrate voltage generating means generates, in said test mode, a voltage lower than that of said normal mode.

4. A semiconductor integrated circuit device according to claim 1, wherein
   said substrate voltage generating means generates, in said test mode, voltages higher and lower than that of said normal mode in a switchable manner.

5. A semiconductor integrated circuit device according to claim 1, wherein
   said test signal generating means generates said test signal when voltages of the signals applied to said external terminals are different from those of a normal operation.

6. A semiconductor integrated circuit device according to claim 1, wherein
   said test signal generating means generates said test signal when timing of the signals applied to said external terminals is different from the timing of a normal operation.

7. A semiconductor integrated circuit device according to claim 1, wherein
   said test signal generating means generates said test signal when voltages of the signals applied to said external terminals are different from those of a normal operation, and timing of the signals applied to said external terminals is different from the timing of a normal operation.

8. A semiconductor integrated circuit device according to claim 5, wherein
   said test signal generating means comprise high voltage detecting means for generating said test signal in response to an application of voltages higher than a voltage of a normal logical level to said external terminals.

9. A semiconductor integrated circuit device according to claim 6, wherein
said external terminals comprise first and second external terminals,
said test signal generating means comprises,
timing detecting means for generating said test signal in response to that timing of a signal applied to said first external terminal and a signal applied to said second external terminal is different from normal timing.

10. A semiconductor integrated circuit device according to claim 7, wherein
said external terminals comprise first and second external terminals,
said test signal generating means comprises,
high voltage detecting means for outputting a predetermined signal in response to the application of a voltage higher than a voltage of a normal logical level to said first external terminal, and
timing detecting means for generating said test signal in response to that timing of the signals applied to said first and second external terminal is different from a normal timing, and that said predetermined signal is applied from said high voltage detecting means (20).

11. A semiconductor integrated circuit device according to claim 1, wherein
said external terminals comprise first and second external terminals,
said test signal generating means comprises,
high voltage detecting means for outputting a predetermined signal in response to the application of a voltage higher than a voltage of a normal logical level to said first external terminal, and
logical means for generating said test signal in response to that a signal of a predetermined logical level is applied to said second external terminal and that said predetermined signal is applied from said high voltage detecting means.

12. A semiconductor integrated circuit device according to claim 1, further comprising:
switching signal generating means, responsive to a predetermined address signal and said test signal from said test signal generating means for applying switching signals to said substrate voltage generating means.

13. A semiconductor integrated circuit device according to claim 1, further comprising:
switching signal generating means responsive to a predetermined address signal and said test signal from said test signal generating means, for outputting a plurality of switching signals,
and wherein said substrate voltage generating means changes the voltage generated in said test mode a plurality of times corresponding to said plurality of switching signals.

14. A semiconductor integrated circuit device according to claim 1, wherein
said substrate voltage generating means comprises:
a first substrate voltage generating circuit for generating a voltage to be applied to said semiconductor substrate in said normal mode,
a second substrate voltage generating circuit for generating a voltage to be applied to said semiconductor substrate in said test mode, and
enable/disable switching means responsive to said test signal for disabling said first substrate voltage generating circuit, and enabling said second substrate voltage generating circuit.

15. A semiconductor integrated circuit device according to claim 1, wherein
said substrate voltage generating means comprises:
an oscillating circuit whose output alternately changes between the first logical lvel and the second logical level,
a charge pump circuit being charged by the output of said oscillating circuit and for generating a fixed voltage defined by an amplitude of the output, and
generated voltage changing means responsive to said test signal for changing a generated voltage in said charge pump circuit.

16. A semiconductor integrated circuit device according to claim 1, wherein
said substrate voltage generating means comprising:
an oscillating circuit whose output alternately changes between a first logical level and a second logical level,
level converting means operating with first and second voltages as reference voltages, for converting an output of said first logical level of said oscillating circuit into one of the first and second voltages for outputting the same, and converting the output of said first logical level of said oscillating circuit into the other of the first and second voltages for outputting the same,
a charge pump circuit being charged with an output of said level converting means and for generating a fixed voltage defined by an amplitude of the output, and
reference voltage switching means responsive to said test signal for selectively changing said first or second voltage.

17. A semiconductor integrated circuit device formed of various circuits integrated on a semiconductor substrate, comprising:
substrate voltage generating means for generating selectively a first substrate voltage or a second substrate voltage to be applied to said semiconductor substrate;
means for detecting a normal operation mode or a testing mode of said semiconductor integrated circuit; and
means responsive to said detecting means for applying selectively said first voltage or said second voltage to said substrate.

18. A method of operating a semiconductor integrated circuit device formed of various circuits integrated on a semiconductor substrate, comprising the steps of:
generating selectively a first substrate voltage or a second substrate voltage;
detecting a normal operation mode or a testing mode of said semiconductor integrated circuit; and, in response,
applying selectively said first substrate voltage and said second substrate voltage to said substrate.

* * * * *